United States Patent
Daishi et al.

(10) Patent No.: US 8,878,207 B2
(45) Date of Patent: Nov. 4, 2014

(54) DISPLAY DEVICE

(75) Inventors: Kazuya Daishi, Saitama-ken (JP); Kenichi Akutsu, Gunma-ken (JP)

(73) Assignee: Japan Display Inc., Tokyo (JP)

( * ) Notice: Subject to any disclaimer, the term of this patent is extended or adjusted under 35 U.S.C. 154(b) by 122 days.

(21) Appl. No.: 13/543,164

(22) Filed: Jul. 6, 2012

(65) Prior Publication Data

US 2013/0009181 A1    Jan. 10, 2013

(30) Foreign Application Priority Data

Jul. 8, 2011   (JP) .................................. 2011-151863
May 16, 2012   (JP) .................................. 2012-112868

(51) Int. Cl.
*H01L 27/15*    (2006.01)
*H01L 51/52*    (2006.01)

(52) U.S. Cl.
CPC ......... *H01L 51/525* (2013.01); *H01L 2251/566* (2013.01); *H01L 51/5246* (2013.01)
USPC ........ 257/89; 257/99; 257/100; 257/E27.121; 438/22; 438/25; 438/26

(58) Field of Classification Search
CPC .............. H01L 51/5246; H01L 51/525; H01L 2251/566; H01L 27/12; H01L 29/4908
USPC .................. 257/59, 89, E27.121, 99, 100, 98; 438/22, 25, 26, 27, 29
See application file for complete search history.

(56) References Cited

U.S. PATENT DOCUMENTS

2005/0200799 A1*  9/2005  Murai ........................... 349/156

FOREIGN PATENT DOCUMENTS

| JP | 11-72773 | 3/1999 |
| JP | 2009-300475 | 12/2009 |
| JP | 2010-175727 | 8/2010 |

* cited by examiner

*Primary Examiner* — Thinh T Nguyen
(74) *Attorney, Agent, or Firm* — Oblon, Spivak, McClelland, Maier & Neustadt, L.L.P.

(57) ABSTRACT

According to one embodiment, a display device includes a first substrate, a second substrate, a display layer, a seal unit, a protrusion and a spacing adjustment layer. The display layer is provided between the first substrate and the second substrate. The seal unit surrounds the display layer between the first substrate and the second substrate. The protrusion is provided along an outer edge of the seal unit at an outside of the seal unit on a first major surface of the first substrate facing the display layer. The spacing adjustment layer is provided along the outer edge at the outside of the seal unit, includes a portion overlaying the protrusion as viewed along a direction from the first substrate toward the second substrate, and is in contact with the protrusion.

9 Claims, 18 Drawing Sheets

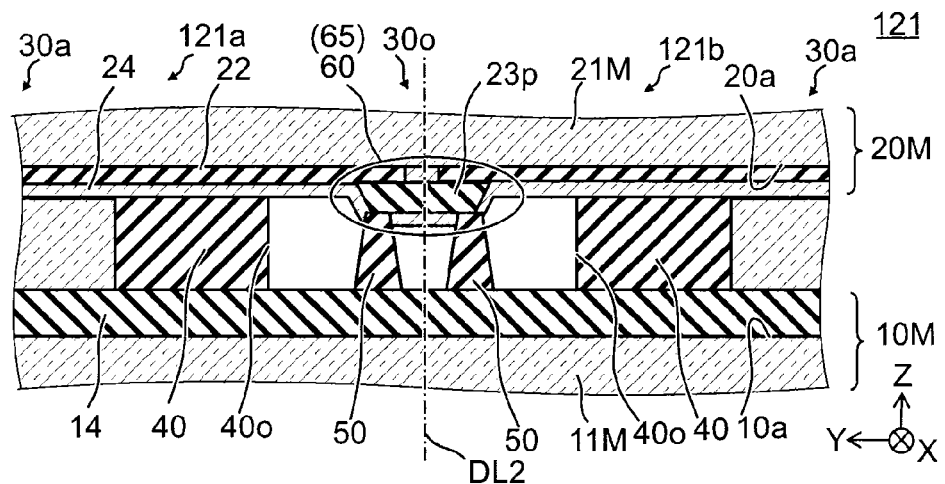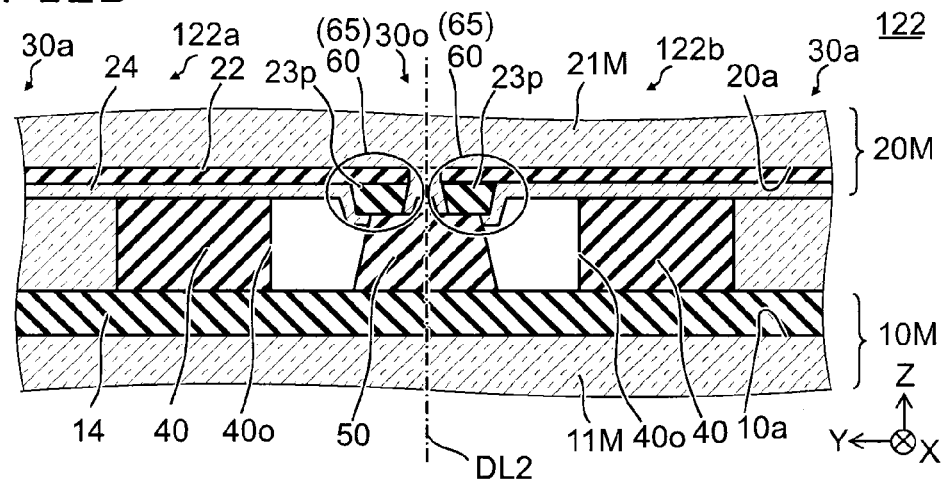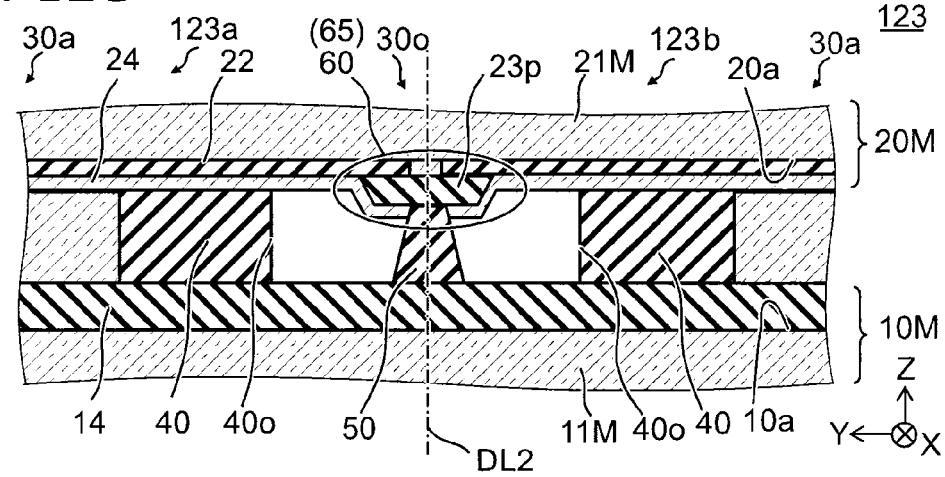

DISPLAY DEVICE

CROSS-REFERENCE TO RELATED APPLICATIONS

This application is based upon and claims the benefit of priority from the prior Japanese Patent Application No. 2011-151863, filed on Jul. 8, 2011, and the prior Japanese Patent Application No. 2012-112868, filed on May 16, 2012; the entire contents of which are incorporated herein by references.

FIELD

Embodiments described herein relate generally to a display device.

BACKGROUND

For instance, there is a liquid crystal display device including a liquid crystal sandwiched between two substrates. In manufacturing such a display device, electrodes for display and the like are formed on original substrates having a larger size than the substrates. After these two original substrates are combined, unnecessary peripheral portions and the like are cut. Thus, the display device is fabricated. In the case of collectively fabricating a plurality of display devices from one pair of original substrates, the original substrates are divided for separation between the plurality of display devices.

Around the display region of the display device, a seal unit for bonding two substrates is provided. If the seal unit overlaps with the aforementioned cutting or dividing position, cut failure occurs. However, if the cut position is distanced from the seal unit, the frame is widened.

BRIEF DESCRIPTION OF THE DRAWINGS

FIG. 12A to FIG. 12C are schematic sectional views illustrating the configuration of alternative display devices according to the second embodiment;

DETAILED DESCRIPTION

Figure 1A:
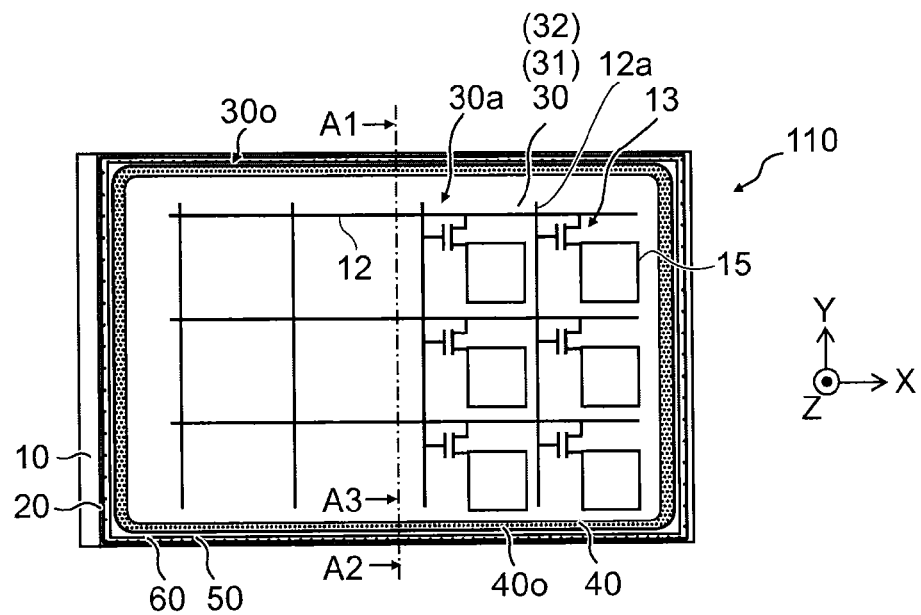
FIG. 1A to FIG. 1C are schematic views illustrating the configuration of a display device according to a first embodiment.

According to one embodiment, a display device includes a first substrate, a second substrate, a display layer, a seal unit, a protrusion and a spacing adjustment layer. The display layer is provided between the first substrate and the second substrate. The seal unit surrounds the display layer between the first substrate and the second substrate. The protrusion is provided along an outer edge of the seal unit at an outside of the seal unit on a first major surface of the first substrate facing the display layer. The spacing adjustment layer is provided along the outer edge at the outside of the seal unit, includes a portion overlaying the protrusion as viewed along a direction from the first substrate toward the second substrate, and is in contact with the protrusion.

According to one embodiment, a display device includes an array substrate unit, an opposing substrate unit, a display layer, and a seal unit. The array substrate unit includes a first substrate, a plurality of pixel electrodes, and a plurality of transistors. The first substrate has a first major surface. The plurality of pixel electrodes are provided on the first major surface. The plurality of transistors are provided on the first major surface. Each of the plurality of transistors is connected to each of the plurality of pixel electrodes. The opposing substrate unit includes a second substrate having a second major surface opposed to the first major surface. The display layer is provided between the array substrate unit and the opposing substrate unit. The seal unit surrounds the display layer between the array substrate unit and the opposing substrate unit. The opposing substrate unit further includes a protrusion, and a spacing adjustment layer. The protrusion is provided along an outer edge of the seal unit outside the seal unit on the second major surface. The spacing adjustment layer is provided along the outer edge between the second substrate and the protrusion.

According to one embodiment, a display device includes an array substrate unit, an opposing substrate unit, a display layer, and a seal unit. The array substrate unit includes a first substrate, a plurality of pixel electrodes, and transistors. The first substrate has a first major surface. The plurality of pixel electrodes are provided on the first major surface. Transistors are provided on the first major surface. Each of the transistors is connected to each of the plurality of pixel electrodes. The opposing substrate unit includes a second substrate having a second major surface opposed to the first major surface. The display layer is provided between the array substrate unit and the opposing substrate unit. The seal unit surrounds the display layer between the array substrate unit and the opposing substrate unit. The opposing substrate unit further includes a protrusion provided along an outer edge of the seal unit at an outside of the seal unit on the second major surface. The array substrate unit further includes a spacing adjustment layer provided along the outer edge at the outside on the first major surface, includes a portion overlaying the protrusion as viewed along a direction from the first substrate toward the second substrate, and is in contact with the protrusion.

According to one embodiment, a display device substrate is used as at least one of two substrates of a display device including the two substrates, a display layer is provided between the substrates, and a seal unit surrounds the display layer between the substrates. The display device substrate includes a plate-like substrate body and a protrusion. The plate-like substrate body has a major surface provided with a display region inside the seal unit and an outside region outside the seal unit. The protrusion is provided along a line constituting an outer edge of the seal unit on the outside region of the major surface.

According to one embodiment, a method is disclosed for manufacturing a display device. The method can include forming a structural body. The structural body includes a first original substrate, a second original substrate, a seal unit, a first protrusion, and a second protrusion. The seal unit surrounds a display region provided between the first original substrate and the second original substrate. The first protrusion is provided along an outer edge of the seal unit on a first major surface of the first original substrate facing the second original substrate at an outside of the seal unit. The second protrusion is provided along the outer edge on a second major surface of the second original substrate facing the first original substrate at the outside of the seal unit and abutting on the first protrusion. In addition, the method can include dividing a portion of the first original substrate outside the seal unit from a portion of the first original substrate inside the seal unit, and dividing a portion of the second original substrate outside the seal unit from a portion of the second original substrate inside the seal unit.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

First Embodiment

Figure 1B:
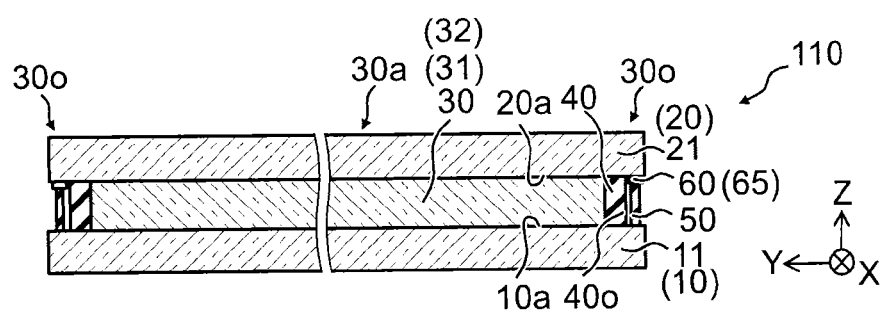
Figure 1C:
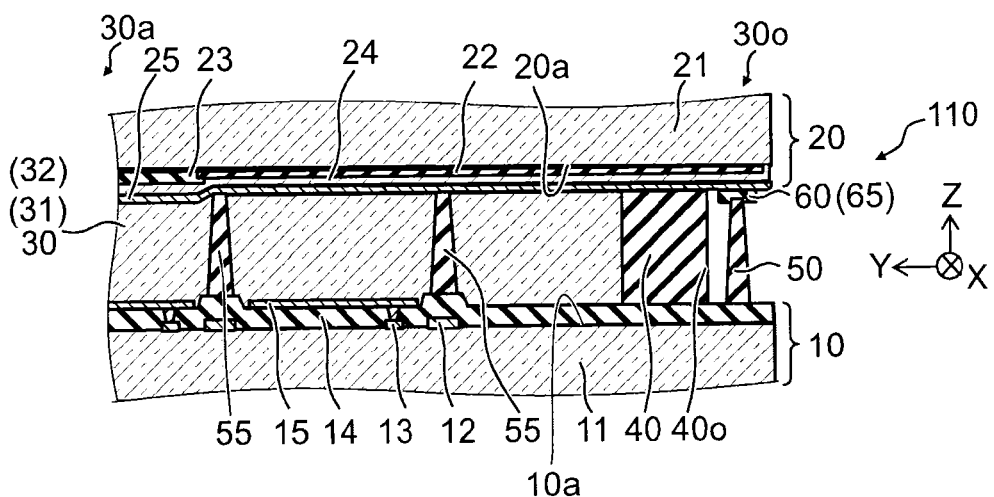

FIG. 1A to FIG. 1C are schematic views illustrating the configuration of a display device according to a first embodiment.

FIG. 1A is a plan view. FIG. 1B is a sectional view taken along line A1-A2 of FIG. 1A. FIG. 1C is a sectional view taken along line A3-A2 of FIG. 1A, and a partial enlarged view of FIG. 1B.

As shown in FIG. 1A to FIG. 1C, the display device 110 according to the embodiment includes a first substrate 11, a second substrate 21, a display layer 30, a seal unit 40, a protrusion (first protrusion 50), and a spacing adjustment layer 65.

The first substrate 11 and the second substrate 21 are e.g. transparent substrates made of e.g. glass. The display layer 30 is provided between the first substrate 11 and the second substrate 21.

The first substrate 11 has a first major surface 10a of the first substrate 11 facing the display layer 30. The second substrate 21 has a second major surface 20a of the second substrate 21 facing the display layer 30.

Here, the axis parallel to the direction from the first substrate 11 toward the second substrate 21 is defined as Z axis (first axis). One axis perpendicular to the Z axis is defined as X axis (second axis). The axis perpendicular to the Z axis and the X axis is defined as Y axis (third axis).

The Z axis is perpendicular to the first major surface 10a. The Z axis is perpendicular to the second major surface 20a.

In the case where the display device 110 is e.g. a liquid crystal display device, the display layer 30 is a liquid crystal layer 31. In the case where the display device 110 is e.g. an organic EL display device of the self-emission type, the display layer 30 is an organic luminescent layer. In the following description, it is assumed that the display layer 30 is a liquid crystal layer 31.

The seal unit 40 surrounds the display layer 30 between the first substrate 11 and the second substrate 21. The seal unit 40 is made of e.g. an organic material such as epoxy resin. The seal unit 40 bonds (e.g., adhesively) together the first substrate 11 and the second substrate 21. The seal unit 40 can be formed by e.g. hardening a liquid composition. This hardening may include at least one treatment of e.g. heating and light irradiation. That is, in the process for manufacturing the display device 110, for instance, the seal unit 40 is formed from a fluid material.

In this example, the first protrusion 50 is provided outside the seal unit 40 on the first major surface 10a of the first substrate 11 facing the display layer 30. As shown in FIG. 1A, the first protrusion 50 is provided along the outer edge 40o of the seal unit 40. For instance, the first protrusion 50 lies along the outer edge 40o.

The spacing adjustment layer 65 is provided along the outer edge 40o of the seal unit 40 outside the seal unit 40. As viewed along the Z axis, the spacing adjustment layer 65 includes a portion overlaying the first protrusion 50. In the following description, for instance, it is assumed that the spacing adjustment layer 65 is a second protrusion 60.

The second protrusion 60 is provided on the second major surface 20a of the second substrate 21 facing the display layer 30 outside the seal unit 40. As shown in FIG. 1A, the second protrusion 60 lies along the outer edge 40o. As shown in FIG. 1B, the second protrusion 60 is in contact with the first protrusion 50. The second protrusion 60 abuts on the first protrusion 50.

The first protrusion 50 and the second protrusion 60 are opposed to each other along the Z axis. For instance, the axis parallel to one side of the first substrate 11 is taken as the X axis. The seal unit 40 includes e.g. a portion extending along the X axis and a portion extending along the Y axis.

In the region surrounded with the seal unit 40, the display layer 30 (liquid crystal layer 31) is provided. The region surrounded with the seal unit 40 is referred to as display region 30a. The outside of the seal unit 40 is referred to as outside region 30o.

That is, in the display device 110, the display region 30a and the outside region 30o are established. In the first substrate 11, the display region 30a inside the seal unit 40 and the outside region 30o outside the seal unit 40 are provided. Similarly, in the second substrate 21, the display region 30a inside the seal unit 40 and the outside region 30o outside the seal unit 40 are provided.

FIG. 1C shows an example configuration of the peripheral portion of the display region 30a, the seal unit 40, and the outside region 30o of the display device 110.

As shown in FIG. 1C, this example includes a first substrate unit 10 and a second substrate unit 20. The first substrate unit 10 includes the first substrate 11. In this example, the first substrate unit 10 further includes interconnections 12, switching elements 13, an interlayer insulating layer 14, and pixel electrodes 15. A plurality of interconnections 12 are provided. The plurality of interconnections 12 extend along e.g. the X axis. In this figure, one interconnection 12 is shown. A plurality of other interconnections (interconnections 12a illustrated in FIG. 1A) are further provided. The other interconnections (interconnections 12a) extend along e.g. the Y axis. The switching elements 13 are provided in a plurality. Each of the plurality of switching elements 13 is connected to one of the plurality of interconnections 12 and one of the plurality of other interconnections (interconnections 12a) (see FIG. 1A). The plurality of switching elements 13 are provided in a matrix configuration along the X axis and the Y axis.

The interlayer insulating layer 14 covers the interconnections 12, the other interconnections (interconnections 12a), and the switching elements 13. On the interlayer insulating layer 14, the pixel electrodes 15 are provided. The pixel electrode 15 is connected to the switching element 13 through an opening provided in the interlayer insulating layer 14.

The second substrate unit 20 includes the second substrate 21. In this example, the second substrate unit 20 further includes a light blocking layer 22 (e.g., black matrix), colored layers 23, an overcoat layer 24, and an opposing electrode 25. The light blocking layer 22 is made of e.g. at least one of metal, metal compound, and resin. One of the colored layers 23 is e.g. blue. Another of the colored layers 23 is e.g. green. Still another of the colored layers 23 is e.g. red. The plurality of colored layers 23 are opposed to the plurality of pixel electrodes 15, respectively. The light blocking layer 22 masks the peripheral portion of the display region 30a. The overcoat layer 24 covers the light blocking layer 22 and the colored layers 23. The opposing electrode 25 is provided on the overcoat layer 24. These components are provided as necessary, and omitted as the case may be. At least one of the colored layer 23 and the overcoat layer 24 is made of e.g. acrylic resin or polyimide-based resin.

In this example, the first substrate unit 10 is an array substrate unit, and the second substrate unit 20 is an opposing substrate unit. The protrusion (first protrusion 50) is provided on the first major surface 10a of the first substrate 11 of the first substrate unit 10. However, the embodiment is not limited thereto. Alternatively, the first substrate unit 10 may be an opposing substrate unit, and the second substrate unit 20 may be an array substrate unit. That is, a light blocking layer, colored layers, an overcoat layer, an opposing electrode and the like may be provided on the first major surface 10a of the first substrate 11 of the first substrate unit 10. Then, switching elements and pixel electrodes 15 may be provided on the second major surface 20a of the second substrate 21 of the second substrate unit 20. In this case, the protrusion is provided on the major surface on the opposing substrate unit side.

A voltage is applied between the pixel electrode 15 and the opposing electrode 25. A voltage is applied to the liquid crystal layer 31. This changes the optical characteristics of the liquid crystal layer 31. A light polarizing layer (not shown) is provided outside the first substrate 11 and outside the second substrate 21. The change of the optical characteristics is converted to the change of transmittance. Thus, the display device 110 performs display.

Here, the opposing electrode 25 may be provided in the first substrate unit 10. In this case, an electric field including a component perpendicular to the Z axis is applied to the liquid crystal layer 31 and changes the optical characteristics. Thus, the configuration and operation mode of the liquid crystal layer 31 are arbitrary.

In the case where the display layer 30 is based on organic EL, a current is supplied to the organic luminescent layer 32 (see FIG. 1A to FIG. 1C) through the switching element 13. Thus, desired light is emitted.

In this example, the display device 110 further includes a plurality of spacing holding units 55 (spacers). The spacing holding unit 55 is provided in the interior (in the display region 30a) surrounded with the seal unit 40. In this example, the spacing holding unit 55 is provided on the first major surface 10a of the first substrate 11. Each of the plurality of spacing holding units 55 holds the spacing between the first substrate 11 and the second substrate 21.

In the specification, the "state of being provided on" includes not only the state of being provided in direct contact, but also the state of being provided with another component interposed in between.

In this example, the plurality of spacing holding units 55 are provided on the interlayer insulating layer 14. This interlayer insulating layer 14 covers the interconnection 12 provided on the first major surface 10a of the first substrate 11. In this example, the spacing holding unit 55 is provided on the portion of the interlayer insulating layer 14 covering the interconnection 12. This case is also included in the case where the spacing holding unit 55 is provided on the first major surface 10a of the first substrate 11. Thus, in this example, the spacing holding unit 55 is provided on the first substrate unit 10.

The spacing holding unit 55 can be made of e.g. an organic resin material. The spacing holding unit 55 can be made of e.g. acrylic resin or polyimide resin. However, the spacing holding unit 55 can be made of an arbitrary material. The spacing holding unit 55 is preferably insulative.

In this example, the first protrusion 50 is provided on the interlayer insulating layer 14 provided on the first substrate 11. That is, the first protrusion 50 is provided on the first substrate unit 10. This case is also included in the case where the first protrusion 50 is provided on the first major surface 10a of the first substrate 11.

The first protrusion 50 can include a material identical to the material included in the spacing holding unit 55. For instance, the first protrusion 50 can be made of a material identical to the material used for the spacing holding unit 55. In this case, the first protrusion 50 can be formed simultaneously and collectively with the spacing holding unit 55. This provides high productivity. Here, the spacing adjustment layer 65 (e.g., second protrusion 60) may include a material identical to the material included in the spacing holding unit 55.

In this example, the second protrusion 60 is provided on the opposing electrode 25. This opposing electrode 25 is provided on the light blocking layer 22 provided on the second major surface 20a of the second substrate 21 and the overcoat layer 24 provided thereon. This case is also included in the case where the second protrusion 60 is provided on the second major surface 20a of the second substrate 21. Thus, in this example, the second protrusion 60 is provided on the second substrate unit 20.

The second protrusion 60 can be made of e.g. an organic resin material. The second protrusion 60 can be made of e.g. acrylic resin or polyimide resin. However, the second protrusion 60 can be made of an arbitrary material. The second protrusion 60 is preferably insulative.

In the case where the display layer 30 is a liquid crystal layer 31, the thickness of the liquid crystal layer 31 is e.g. approximately 2 micrometers (μm) or more and 8 μm or less. Then, the spacing holding unit 55 has a thickness (height) substantially equal to the thickness of the liquid crystal layer 31.

The height of the first protrusion 50 can be made substantially equal to the height of the spacing holding unit 55. The height of the second protrusion 60 can be set to e.g. 0.5 μm or more and 3 μm or less.

The width (the length along the direction from the display region 30a toward the outside region 30o, and in FIG. 1C, the length along the Y axis) of the first protrusion 50 is e.g. 10 μm or more and 100 μm or less. Here, the width of the first protrusion 50 is the length of the first protrusion 50 along the axis orthogonal to the extending axis of the outer edge 40o of the seal unit 40 along which the first protrusion 50 lies.

The width (the length along the direction from the display region 30a toward the outside region 30o, and in FIG. 1C, the length along the Y axis) of the second protrusion 60 is e.g. 10 μm or more and 100 μm or less. Here, the width of the second protrusion 60 is the length of the second protrusion 60 along the axis orthogonal to the extending axis of the outer edge 40o of the seal unit 40 along which the second protrusion 60 lies. The width of the second protrusion 60 may be less than or equal to the width of the first protrusion 50, or greater than or equal to the width of the first protrusion 50.

In the following, an example method for manufacturing a display device according to the embodiment is described.

Figure 2:
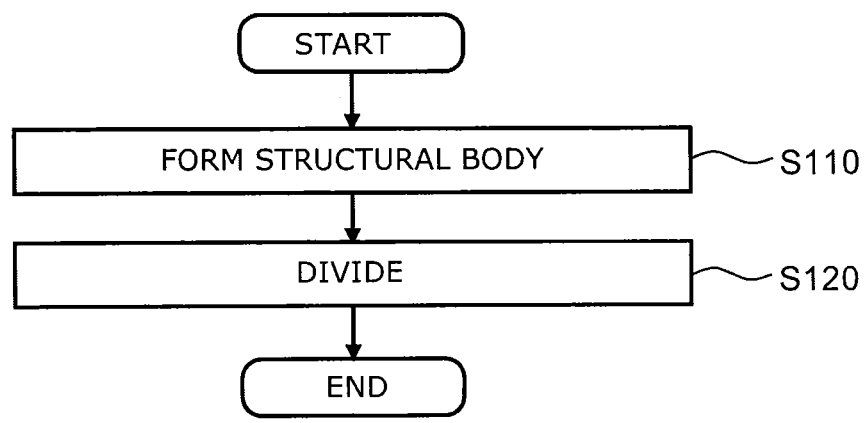
FIG. 2 is a flow chart illustrating a method for manufacturing the display device according to the first embodiment.

FIG. 2 is a flow chart illustrating the method for manufacturing a display device according to the first embodiment.

Figure 3A:
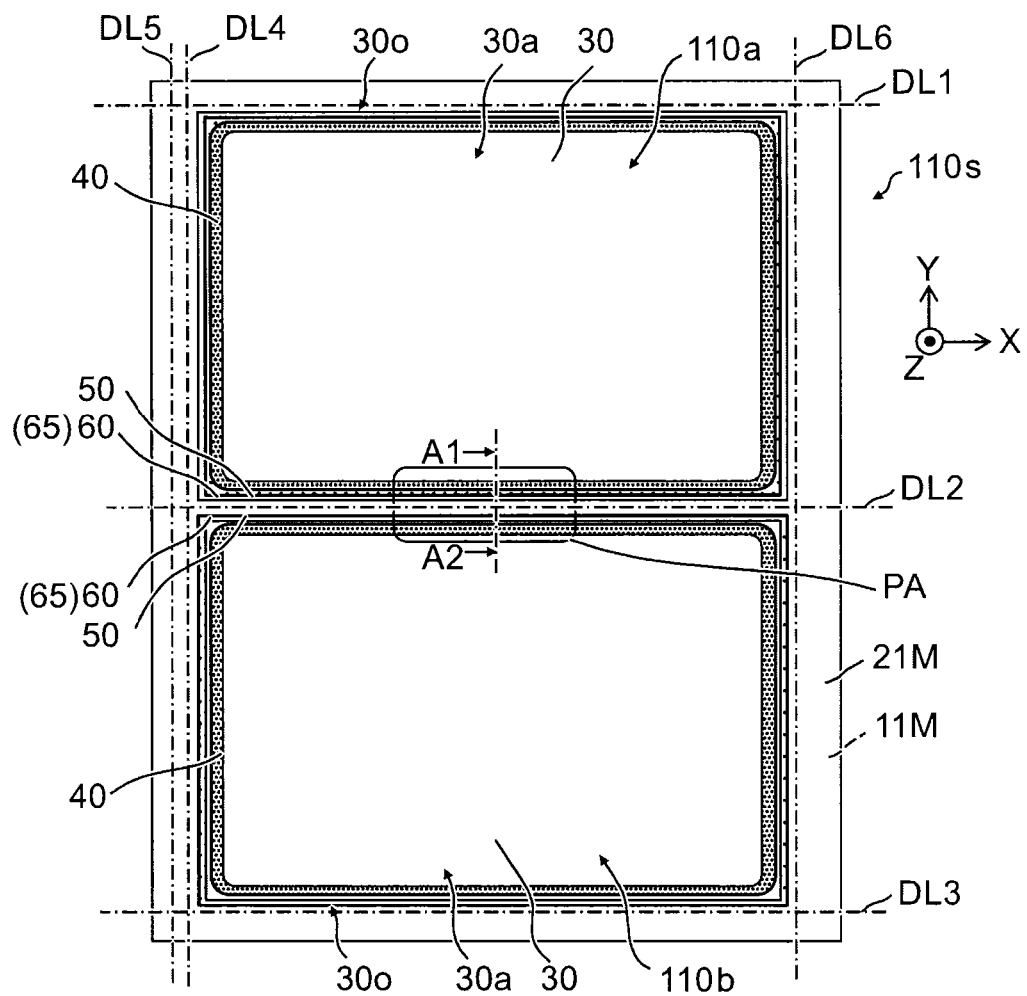
FIG. 3A and FIG. 3B are schematic plan views illustrating the method for manufacturing the display device according to the first embodiment.
Figure 3B:
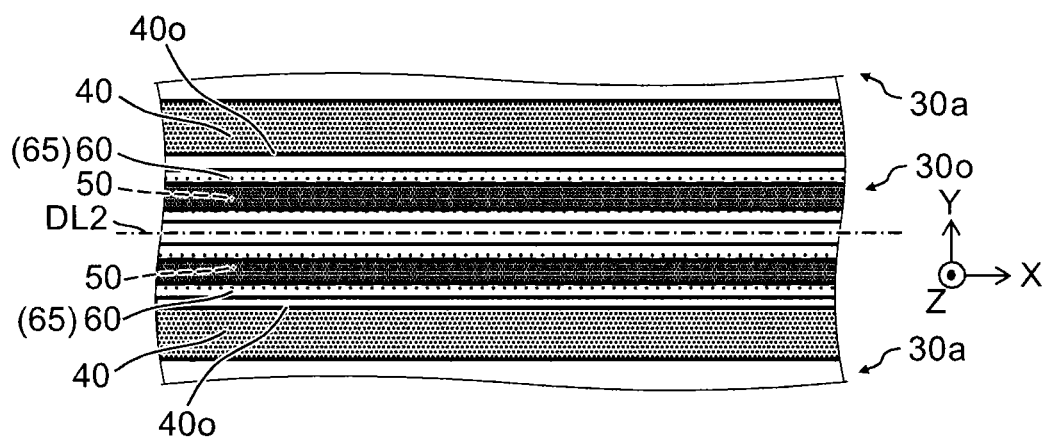

FIG. 3A and FIG. 3B are schematic plan views illustrating the method for manufacturing a display device according to the first embodiment.

More specifically, FIG. 3A is a plan view. FIG. 3B is an enlarged plan view showing a portion PA of FIG. 3A.

Figure 4:
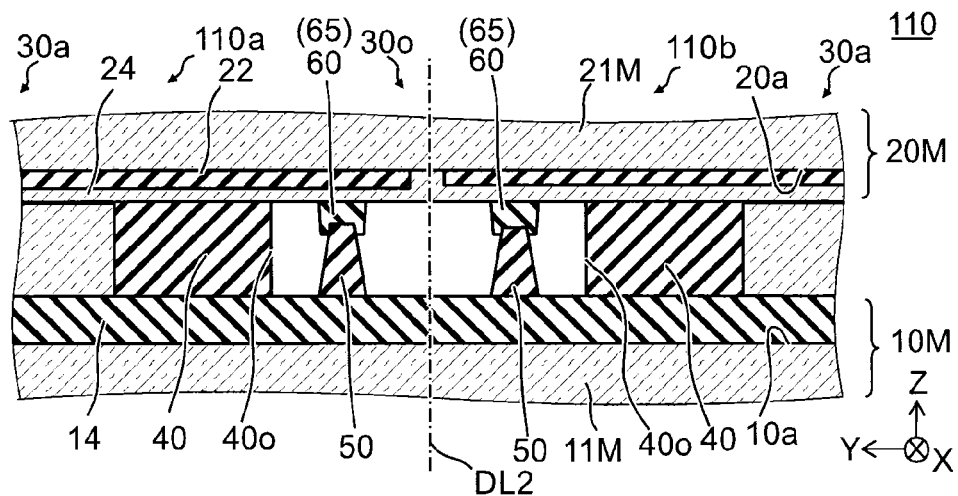
FIG. 4 is a schematic sectional view illustrating the method for manufacturing the display device according to the first embodiment.

FIG. 4 is a schematic sectional view illustrating the method for manufacturing a display device according to the first embodiment.

FIG. 4 is a sectional view taken along line A1-A2 of FIG. 3A.

As shown in FIG. 2, the method for manufacturing a display device according to the embodiment includes forming a structural body (step S110) and division (step S120).

As shown in FIG. 3A and FIG. 4, in the method for manufacturing a display device according to the embodiment, a structural body 110s is formed.

The structural body 110s includes a first original substrate 11M, a second original substrate 21M, a seal unit 40, a first protrusion 50, and a second protrusion 60.

In this example, from a pair of the first original substrate 11M and the second original substrate 21M, two display devices 110 (display devices 110a and 110b) are collectively fabricated. Here, the number of display devices 110 fabricated from a pair of the first original substrate 11M and the second original substrate 21M is arbitrary.

As described later, the first original substrate 11M is cut into a first substrate 11. The second original substrate 21M is cut into a second substrate 21.

A display region 30a is provided between the first original substrate 11M and the second original substrate 21M. In this example, two display regions 30a are provided. The seal unit 40 surrounds the display region 30a provided between the first original substrate 11M and the second original substrate 21M.

The first protrusion 50 is provided on the first major surface 10a of the first original substrate 11M facing the second original substrate 21M outside the seal unit 40. The first protrusion 50 lies along the outer edge 40o of the seal unit 40.

The second protrusion 60 is provided on the second major surface 20a of the second original substrate 21M facing the first original substrate 11M outside the seal unit 40. The second protrusion 60 lies along the outer edge 40o of the seal unit 40. The second protrusion 60 is in contact with the first protrusion 50. The second protrusion 60 abuts on the first protrusion 50.

Furthermore, in this manufacturing method, the portion of the first original substrate 11M outside the seal unit 40 is divided from the portion of the first original substrate 11M inside the seal unit 40. The portion of the second original substrate 21M outside the seal unit 40 is divided from the portion of the second original substrate 21M inside the seal unit 40 (step S120).

As shown in FIG. 3A, along the division lines DL1-DL6, the first original substrate 11M and the second original substrate 21M are cut. Here, on the division lines DL1, DL2, DL3, and DL6, the first original substrate 11M and the second original substrate 21M are cut. On the division line DL4, the second original substrate 21M is cut. On the division line DL5, the first original substrate 11M is cut. Thus, two display devices 110 (display devices 110a and 110b) are obtained.

Here, the structural body 110s formed in step S110 may be in the state after the display layer 30 is formed. In this case, step S120 is performed in the state in which the display layer 30 of the liquid crystal layer 31 (or e.g. organic luminescent layer 32) is sandwiched between the first original substrate 11M and the second original substrate 21M.

Alternatively, the structural body 110s formed in step S110 may be in the state before the display layer 30 is formed. In this case, for instance, step S120 is performed in the state in which there is a space between the first original substrate 11M and the second original substrate 21M. Then, liquid crystal is injected into the space of each of the divided display devices 110a and 110b. Thus, the liquid crystal layer 31 (display layer 30) is formed.

Thus, this manufacturing method can be variously modified.

As shown in FIG. 3B, the first protrusion 50 and the second protrusion 60 lie along the outer edge 40o of the seal unit 40.

In this example, as shown in FIG. 3B and FIG. 4, the division line DL2 is provided between the first protrusion 50 on the display device 110a side and the first protrusion 50 on the display device 110b side, and between the second protrusion 60 on the display device 110a side and the second protrusion 60 on the display device 110b side.

The first protrusion 50 and the second protrusion 60 are in contact (abutment) with each other. Thus, the first protrusion 50 is closely attached to the second protrusion 60. That is, the first protrusion 50 forms a wall in conjunction with the second protrusion 60. For instance, the position of the seal unit 40 may be displaced from the design position, or the width of the seal unit 40 may be larger than the design value. However, even in these cases, the wall made of the first protrusion 50 and the second protrusion 60 blocks the liquid composition constituting the seal unit 40 (stops the flow of the composition). Thus, even in such cases, the division line DL2 does not overlap with the seal unit 40. This suppresses the occurrence of cut failure.

Furthermore, because the seal unit 40 does not overlap with the division line DL2, the seal unit 40 and the division line DL2 can be made close to each other. This can narrow the width of the frame. Here, the width of the frame is e.g. the distance from the end of the display region 30a to the end of the first substrate 11 and the second substrate 21.

Thus, the embodiment can provide a display device having a narrow frame.

When the first protrusion 50 is formed simultaneously and collectively with the spacing holding unit 55, the height of the upper surface of the first protrusion 50 is likely to become lower than the height of the upper surface of the spacing holding unit 55.

The reason for this is as follows. As illustrated in FIG. 1C, the spacing holding unit 55 is disposed between the pixels (e.g., corresponding to the pixel electrodes 15). Thus, the spacing holding unit 55 is provided on various layers (e.g., interconnection 12) included in the first substrate unit 10. Hence, by the thickness of these layers, the height of the upper surface of the first protrusion 50 is made lower than the height of the upper surface of the spacing holding unit 55.

Here, in the case where the second protrusion 60 in contact (abutment) with the first protrusion 50 is not provided, a gap occurs between the first protrusion 50 and the second substrate unit 20. If this gap occurs, the material (liquid composition) of the seal unit 40 passes through this gap into the position of the division line (e.g., division line DL2). Entry of the material constituting the seal unit 40 under the division line causes cut failure in cutting the original substrate.

Thus, in the case where the second protrusion 60 is not provided, the position of the seal unit 40 cannot be made sufficiently close to the end of the first substrate 11 and the end of the second substrate 21. This places a limit on the narrowing of the width of the frame.

In contrast, in the display device 110 according to the embodiment, the first protrusion 50 and the second protrusion 60 in contact (abutment) with the first protrusion 50 are provided. Thus, the first protrusion 50 and the second protrusion 60 form a wall. Hence, the division line DL2 does not overlap with the seal unit 40. This suppresses the occurrence of cut failure. Thus, a display device having a narrow frame can be provided.

For the first protrusion 50 and the second protrusion 60 to be able to form a wall, the first protrusion 50 lies along the outer edge 40o of the seal unit 40, and the second protrusion 60 lies along the outer edge 40o of the seal unit 40. Preferably, the first protrusion 50 and the second protrusion 60 are provided continuously along the outer edge 40o of the seal unit 40. Here, in the case where the display device 110 is provided with an injection port for injecting liquid crystal, the first protrusion 50 and the second protrusion 60 may not lie along the seal unit 40 in the portion where the injection port is to be formed.

At least one of the first protrusion 50 and the second protrusion 60 may be discontinuous as long as the first protrusion 50 and the second protrusion 60 can form a wall and control the seal unit 40 so as to avoid overlapping with the division line.

Preferably, the second protrusion 60 is entirely in contact (abutment) with the first protrusion 50. This enhances the effect of blocking the material constituting the seal unit 40. However, part of the second protrusion 60 may be spaced from the first protrusion 50 as long as the first protrusion 50 and the second protrusion 60 can form a wall to block the material of the seal unit 40 and substantially prevent the seal unit 40 from overlapping with the division line. For instance, due to variations in the manufacturing process, the height of at least part of the first protrusion 50 and the second protrusion 60 may be made lower than the other portion.

A certain gap may be fabricated partly between the first protrusion 50 and the second protrusion 60 so that the gas contained in the space between the seal unit 40 and the wall formed by the first protrusion 50 and the second protrusion 60 can be exchanged with the outside of the space. This can suppress failure potentially caused by the temperature change of the display device.

Thus, even in the case where a certain gap is formed partly between the first protrusion 50 and the second protrusion 60, the first protrusion 50 and the second protrusion 60 form a wall as a whole and block the material of the seal unit 40 (stops the flow of the material of the seal unit 40). This suppresses the occurrence of cut failure. Thus, a display device having a narrow frame can be provided.

Figure 5:
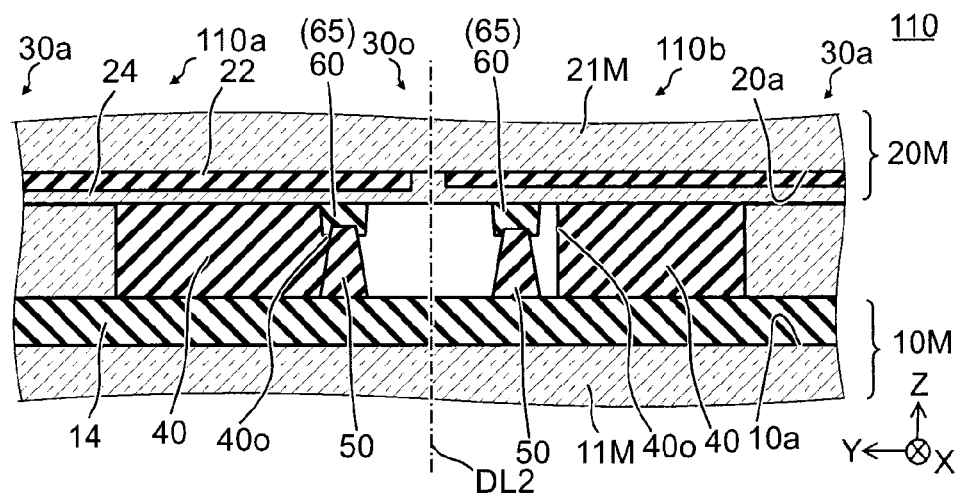
FIG. 5 is a schematic sectional view illustrating the configuration of the display device according to the first embodiment.

FIG. 5 is a schematic sectional view illustrating the configuration of the display device according to the first embodiment.

This figure illustrates the configuration of the peripheral portion of the display device 110.

As shown in FIG. 5, in the display device 110 according to the embodiment, the seal unit 40 may be in contact with at least one of the first protrusion 50 and the second protrusion 60. For instance, due to variations in the manufacturing process, the seal unit 40 may be in contact with the first protrusion 50 and the second protrusion 60 on the display device 110a side, but may be separated from the first protrusion 50 and the second protrusion 60 on the display device 110b side.

Also in such a case, the first protrusion 50 and the second protrusion 60 form a wall, thereby blocking the material of the seal unit 40.

Figure 6A:
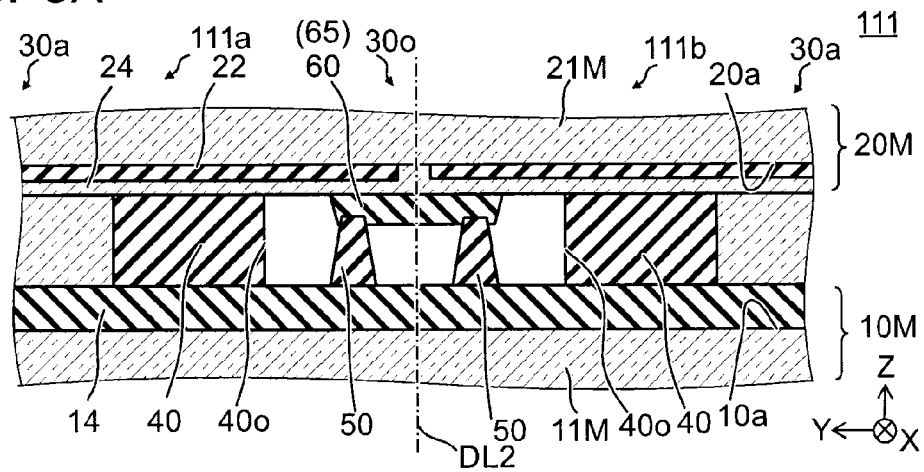
FIG. 6A to FIG. 6C are schematic sectional views illustrating the configuration of alternative display devices according to the first embodiment.
Figure 6B:
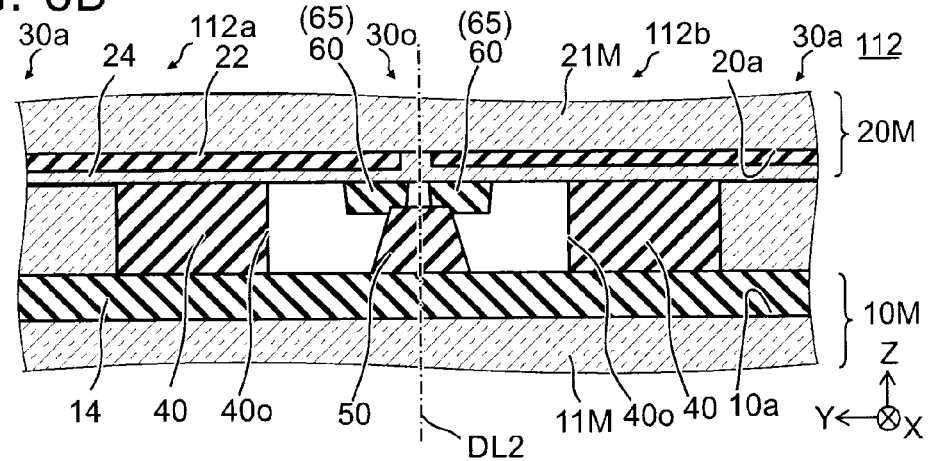
Figure 6C:
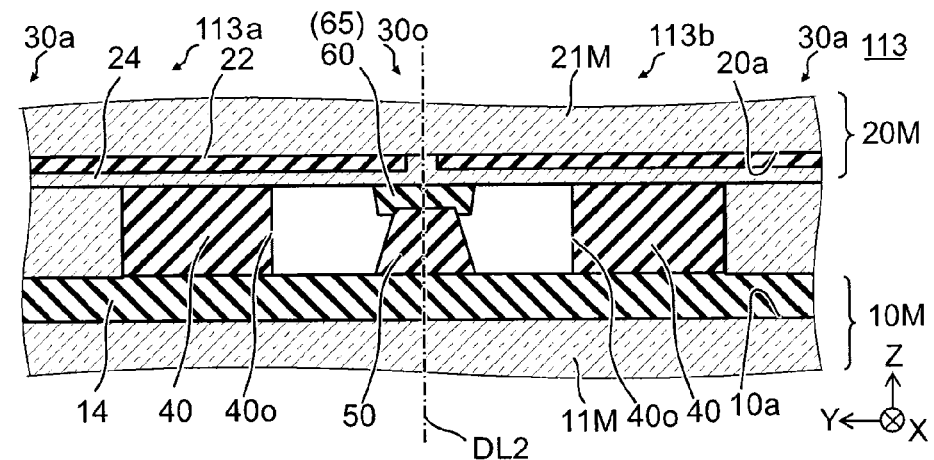

FIG. 6A to FIG. 6C are schematic sectional views illustrating the configuration of alternative display devices according to the first embodiment.

These figures illustrate the configuration of the peripheral portion of the display devices according to the embodiment.

As shown in FIG. 6A, in the display device 111, the division line DL2 overlaps with the second protrusion 60. That is, the second protrusion 60 is provided on the boundary between the display device 111a and the display device 111b. The first protrusion 50 provided in the display device 111a is in contact with part of the second protrusion 60. The first protrusion 50 provided in the display device 111b is in contact with another part of the second protrusion 60. Thus, the second protrusion 60 may be shared by the adjacent display devices 111a and 111b.

As shown in FIG. 6B, in the display device 112, the division line DL2 overlaps with the first protrusion 50. That is, the first protrusion 50 is provided on the boundary between the display device 112a and the display device 112b. The second protrusion 60 provided in the display device 112a is in contact with part of the first protrusion 50. The second protrusion 60 provided in the display device 112b is in contact with another part of the first protrusion 50. Thus, the first protrusion 50 may be shared by the adjacent display devices 112a and 112b.

As shown in FIG. 6C, in the display device 113, the first protrusion 50 and the second protrusion 60 overlap with the division line DL2. That is, the first protrusion 50 and the second protrusion 60 are provided on the boundary between the display device 113a and the display device 113b. The first protrusion 50 and the second protrusion 60 may be shared by the adjacent display devices 113a and 113b.

Figure 7:
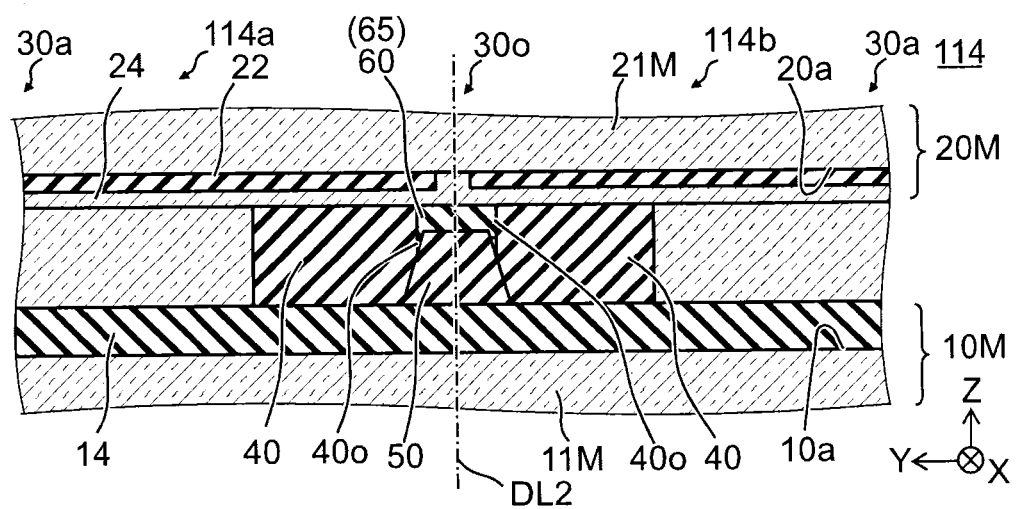
FIG. 7 is a schematic sectional view illustrating the configuration of an alternative display device according to the first embodiment.

FIG. 7 is a schematic sectional view illustrating the configuration of an alternative display device according to the first embodiment.

As shown in FIG. 7, in the display device 114, the first protrusion 50 and the second protrusion 60 are in contact with the seal unit 40. That is, the first protrusion 50 and the second protrusion 60 are provided on the boundary between the display device 114a and the display device 114b adjacent to each other. The seal unit 40 is closely attached to the first protrusion 50 and the second protrusion 60. This configuration realizes a very narrow frame. Also in this case, the first protrusion 50 and the second protrusion 60 constitute a wall. Thus, the division line DL2 does not overlap the seal unit 40. This can suppress the occurrence of cut failure.

FIG. 8A to FIG. 8C and FIG. 9 are schematic sectional views illustrating the configuration of alternative display devices according to the first embodiment.

These figures show the end surface portion of the display devices 111-114 formed by cutting the first original substrate 11M and the second original substrate 21M in the state illustrated in FIG. 6A to FIG. 6C and FIG. 7.

As shown in FIG. 8A to FIG. 8C and FIG. 9, the first protrusion 50 has a first outer end surface 50e and a first inner end surface 50f. The first outer end surface 50e and the first inner end surface 50f are non-parallel to the first major surface 10a. The first inner end surface 50f is opposed to the outer edge 40o of the seal unit 40. The first outer end surface 50e is a surface on the opposite side to the first inner end surface 50f. The first outer end surface 50e faces the outside of the display device.

The second protrusion 60 has a second outer end surface 60e and a second inner end surface 60f. The second outer end surface 60e and the second inner end surface 60f are non-parallel to the second major surface 20a. The second inner end surface 60f is opposed to the outer edge 40o of the seal unit 40. The second outer end surface 60e is a surface on the opposite side to the second inner end surface 60f. The second outer end surface 60e faces the outside of the display device.

The first substrate 11 has an end surface (e.g., first substrate end surface 11e) non-parallel to the first major surface 10a. The second substrate 21 has an end surface (e.g., second substrate end surface 21e) non-parallel to the second major surface 20a.

Figure 8A:
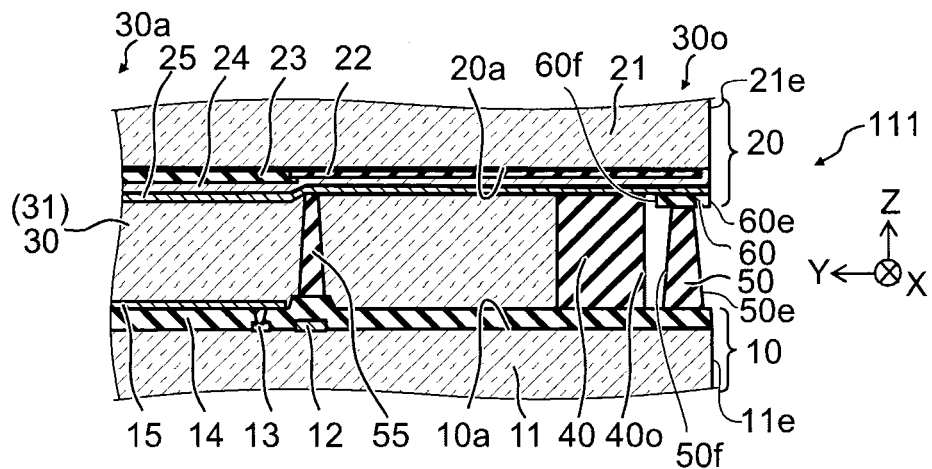
FIG. 8A to FIG. 8C are schematic sectional views illustrating the configuration of alternative display devices according to the first embodiment.

As shown in FIG. 8A, in the display device 111, the second outer end surface 60e is located in the plane including one end surface (second substrate end surface 21e) of the second substrate 21. This results from the fact that, as illustrated in FIG. 6A, the second substrate 21 and the second protrusion 60 are collectively divided along one division line DL2.

Figure 8B:
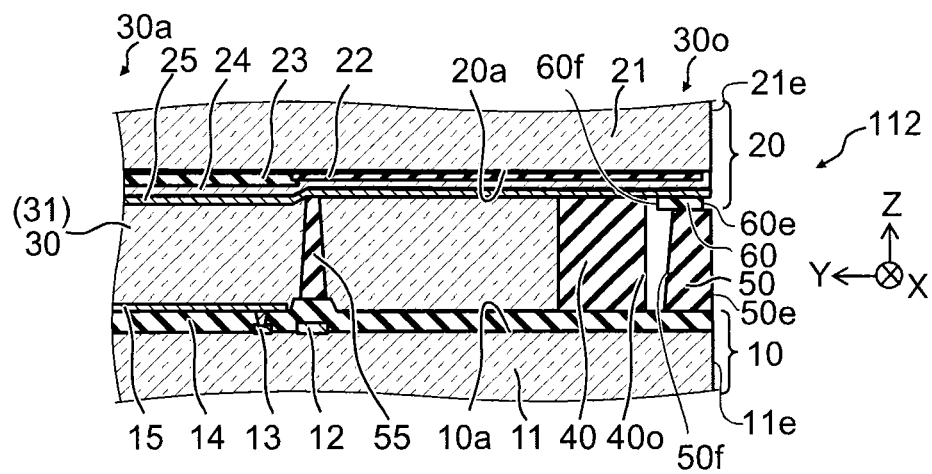

As shown in FIG. 8B, in the display device 112, the first outer end surface 50e is located in the plane including one end surface (first substrate end surface 11e) of the first substrate 11. This results from the fact that, as illustrated in FIG. 6B, the first substrate 11 and the first protrusion 50 are collectively divided along one division line DL2.

Figure 8C:
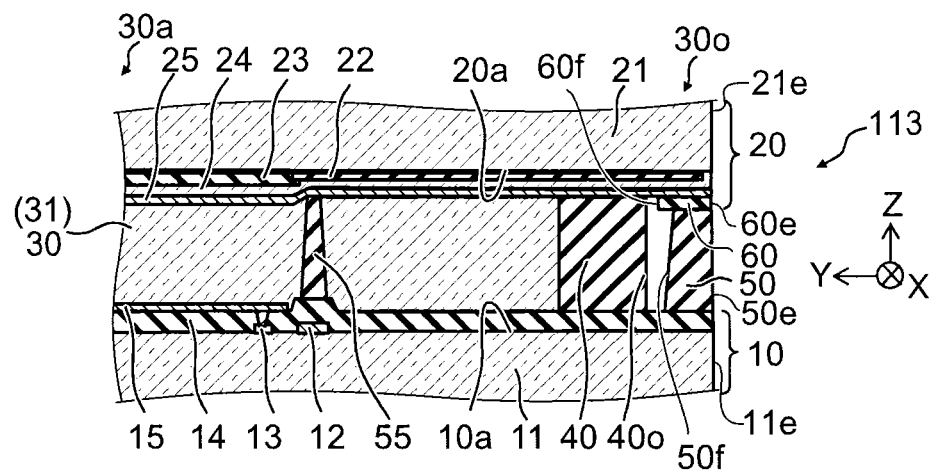

As shown in FIG. 8C, in the display device 113, the first outer end surface 50e and the second outer end surface 60e are located in the plane including one end surface (first substrate end surface 11e) of the first substrate 11. The first outer end surface 50e and the second outer end surface 60e are located in the plane including one end surface (second substrate end surface 21e) of the second substrate 21. This results from the fact that, as illustrated in FIG. 6C, the first substrate 11, the second substrate 21, the first protrusion 50, and the second protrusion 60 are collectively divided along one division line DL2.

Figure 9:
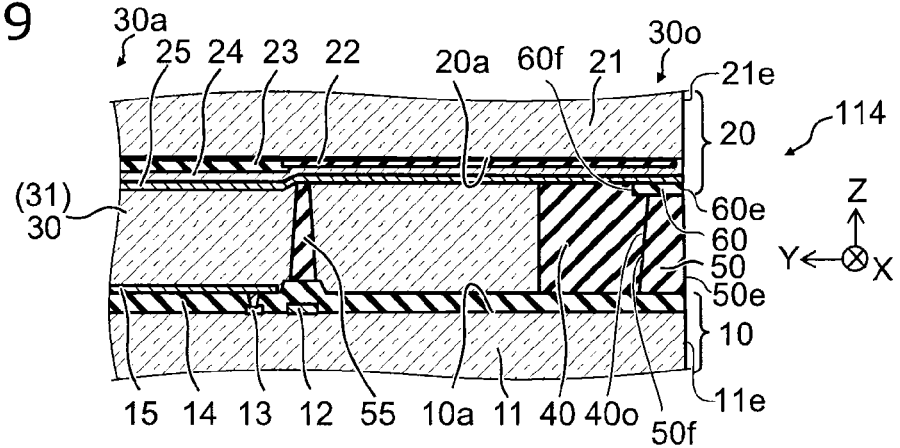
FIG. 9 is a schematic sectional view illustrating the configuration of alternative display device according to the first embodiment.

As shown in FIG. 9, also in the display device 114, the first outer end surface 50e and the second outer end surface 60e are located in the plane including one end surface (first substrate end surface 11e) of the first substrate 11. The first outer end surface 50e and the second outer end surface 60e are located in the plane including one end surface (second substrate end surface 21e) of the second substrate 21.

Thus, in the display devices 112, 113, and 114, at least part of the outer end surface (first outer end surface 50e) of the protrusion (first protrusion 50) is located in the plane including one end surface (first substrate end surface 11e) of the first substrate 11. At least one of the first protrusions 50 overlaps the position of the division line DL2. This can further narrow the frame.

The position in a first direction (e.g., Y-axis direction) of one end (first substrate end surface 11e) in the first direction of the first substrate 11 in the first major surface 10a lies at the position in the above first direction of the end (first outer end surface 50e) in the above first direction of the portion of the protrusion (first protrusion 50) provided at the outer edge 40o including the above one end.

Furthermore, in the display device 114, the seal unit 40 is brought into contact with the first protrusion 50 and the second protrusion 60. This can further narrow the frame.

Second Embodiment

Figure 10:
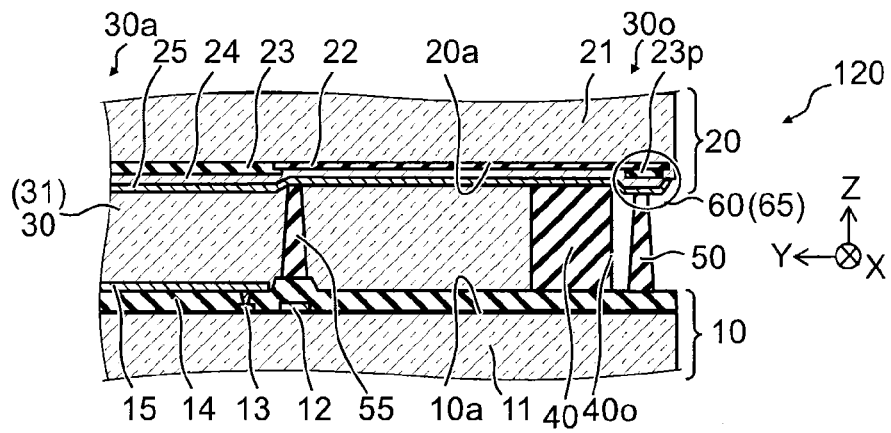
FIG. 10 is a schematic sectional view illustrating the configuration of a display device according to a second embodiment.

FIG. 10 is a schematic sectional view illustrating the configuration of a display device according to a second embodiment.

This figure is a sectional view corresponding to the cross section taken along line A3-A2 of FIG. 1A.

As shown in FIG. 10, the display device 120 according to the embodiment includes a first substrate 11, a second substrate 21, a display layer 30, a seal unit 40, a first protrusion 50, and a second protrusion 60.

Also in this case, the first protrusion 50 is provided on the first major surface 10a of the first substrate 11 facing the display layer 30 outside the seal unit 40. The first protrusion 50 lies along the outer edge 40o of the seal unit 40.

The second protrusion 60 is provided on the second major surface 20a of the second substrate 21 facing the display layer 30 outside the seal unit 40. The second protrusion 60 lies along the outer edge 40o. The second protrusion 60 is in contact with the first protrusion 50. The second protrusion 60 abuts on the first protrusion 50.

In the display device 120, the second protrusion 60 has a stacked structure. More specifically, on the second major surface 20a of the second substrate 21, a light blocking layer 22, a colored layer 23, an overcoat layer 24, and an opposing electrode 25 are provided in this order. Furthermore, the second protrusion 60 includes a first protrusion colored layer 23p. The first protrusion colored layer 23p is provided on the second major surface 20a of the second substrate 21 facing the display layer 30 outside the seal unit 40. The first protrusion colored layer 23p lies along the outer edge 40o. On this first protrusion colored layer 23p, the overcoat layer 24 and the opposing electrode 25 are provided in this order. In this example, the first protrusion colored layer 23p, and the overcoat layer 24 and the opposing electrode 25 provided thereon are provided in the region outside the seal unit 40. These stacked films are included in the second protrusion 60.

Thus, the display device 120 can further include a colored layer 23 provided on the second major surface 20a of the second substrate 21 in the interior surrounded with the seal unit 40. Furthermore, the second protrusion 60 includes a material identical to the material included in the colored layer 23. In this case, the second protrusion 60 includes a first protrusion colored layer 23p formed from the material included in the colored layer 23.

As described above, the colored layers 23 can include e.g. layers of different colors such as blue, green, and red. The first protrusion colored layer 23p can be made of a material of an arbitrary color. The spacing adjustment layer 65 (second protrusion 60) can include at least one of a blue portion and a green portion. If the first protrusion colored layer 23p is blue or green, the first protrusion colored layer 23p is less likely to be conspicuous. In particular, blue has low visibility. Thus, the first protrusion colored layer 23p is preferably blue in view of appearance.

Thus, at least part of the second protrusion 60 can be made of a layer similar to the colored layer 23. Thus, the second protrusion 60 can be formed with high productivity.

The display device 120 can also be manufactured by the manufacturing method including step S110 and step S120 described above.

Figure 11:
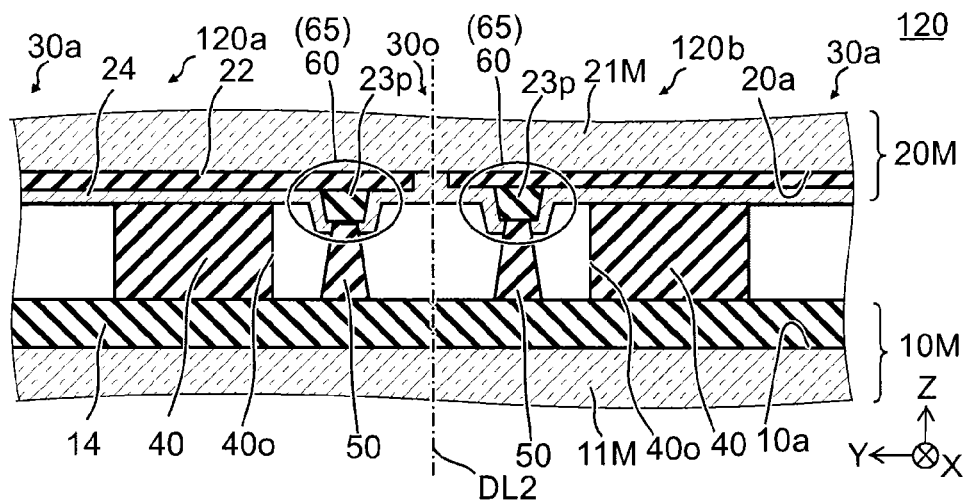
FIG. 11 is a schematic sectional view illustrating a method for manufacturing the display device according to the second embodiment.

FIG. 11 is a schematic sectional view illustrating a method for manufacturing a display device according to the second embodiment.

FIG. 11 is a sectional view corresponding to the cross section taken along line A1-A2 of FIG. 3A.

As shown in FIG. 11, also in the display device 120, a plurality of display devices 120 (display devices 120a and 120b) can be collectively manufactured.

As shown in FIG. 11, the division line DL2 is provided between the first protrusion 50 and the second protrusion 60 on the display device 120a side on one hand, and the first protrusion 50 and the second protrusion 60 on the display device 120b side on the other.

Also in this case, the first protrusion 50 and the second protrusion 60 are in contact (abutment) with each other. The first protrusion 50 forms a wall in conjunction with the second protrusion 60. This wall blocks the material constituting the seal unit 40. This suppresses the occurrence of cut failure. Furthermore, a display device having a narrow frame can be provided.

FIG. 12A to FIG. 12C are schematic sectional views illustrating the configuration of alternative display devices according to the second embodiment.

These figures illustrate the configuration of the peripheral portion of the display devices according to the embodiment.

As shown in FIG. 12A, in the display device 121, the division line DL2 overlaps with the second protrusion 60. The second protrusion 60 including the first protrusion colored layer 23p is provided on the boundary between the display device 121a and the display device 121b. The second protrusion 60 including the first protrusion colored layer 23p may be shared by the adjacent display devices 121a and 121b.

As shown in FIG. 12B, in the display device 122, the division line DL2 overlaps with the first protrusion 50. The first protrusion 50 is provided on the boundary between the display device 122a and the display device 122b. Each of the display devices 122a and 122b includes a second protrusion 60 including a first protrusion colored layer 23p.

As shown in FIG. 12C, in the display device 123, the first protrusion 50 and the second protrusion 60 including the first protrusion colored layer 23p overlap with the division line DL2. The first protrusion 50 and the second protrusion 60 including the first protrusion colored layer 23p are provided on the boundary between the display device 123a and the display device 123b.

Figure 13:
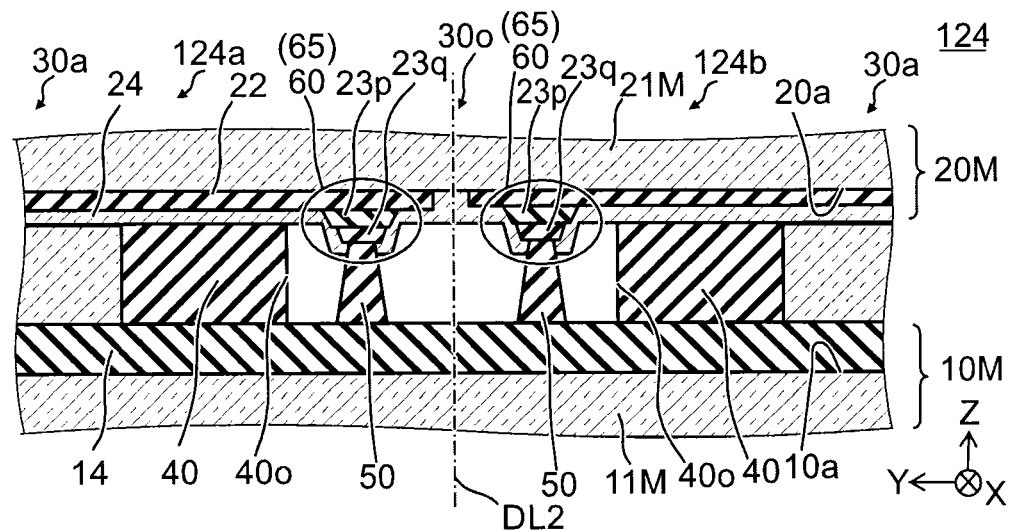
FIG. 13 is a schematic sectional view illustrating the configuration of an alternative display device according to the second embodiment.

FIG. 13 is a schematic sectional view illustrating the configuration of an alternative display device according to the second embodiment. As shown in FIG. 13, in the display device 124 according to the embodiment, the second protrusion 60 includes a plurality of stacked colored layers. That is, on the first protrusion colored layer 23p, a second protrusion colored layer 23q is provided. The color of the first protrusion colored layer 23p is different from the color of the second protrusion colored layer 23q. Here, on the second protrusion colored layer 23q, another protrusion colored layer may be further provided. The second protrusion 60 includes the first protrusion colored layer 23p and the second protrusion colored layer 23q. In this example, the second protrusion 60 further includes a light blocking layer 22 and an overcoat layer 24.

Thus, the second protrusion 60 can include a plurality of protrusion colored layers (e.g., first protrusion colored layer 23p and second protrusion colored layer 23q). This can increase the height of the second protrusion 60. Thus, the second protrusion 60 is closely attached to the first protrusion 50 more robustly.

Figure 14:
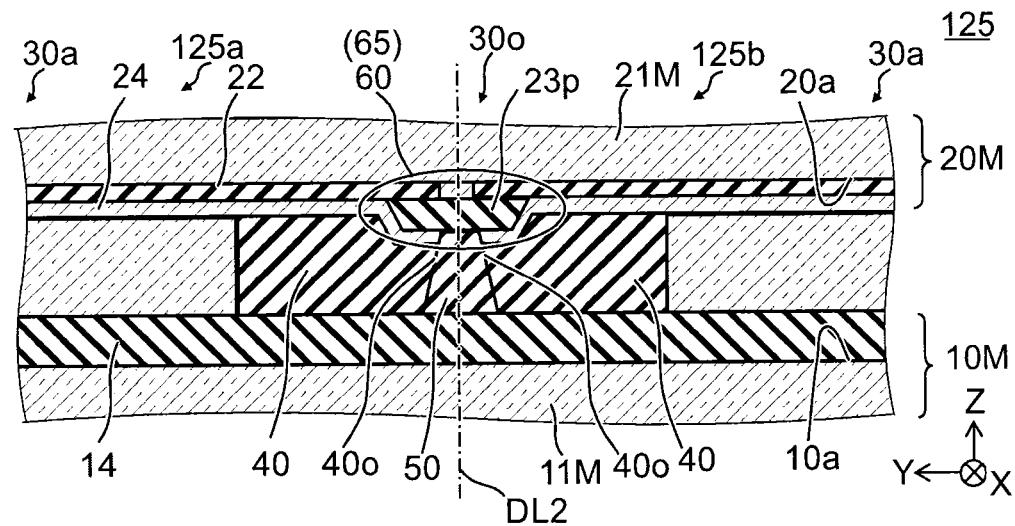
FIG. 14 is a schematic sectional view illustrating the configuration of an alternative display device according to the second embodiment.

FIG. 14 is a schematic sectional view illustrating the configuration of an alternative display device according to the second embodiment. As shown in FIG. 14, in the display device 125, the second protrusion 60 includes a first protrusion colored layer 23p. Furthermore, the first protrusion 50 and the second protrusion 60 are in contact with the seal unit 40. That is, the first protrusion 50 and the second protrusion 60 are provided on the boundary between the display device 125a and the display device 125b adjacent to each other. The seal unit 40 is closely attached to the first protrusion 50 and the second protrusion 60. This realizes a very narrow frame. Also in this case, the first protrusion 50 and the second protrusion 60 constitute a wall. Thus, the division line DL2 does not overlap the seal unit 40. This can suppress the occurrence of cut failure.

In FIG. 11, FIG. 12A to 12C, FIG. 13, and FIG. 14, for clarity of illustration, the opposing electrode 25 is not shown.

FIG. 15A to FIGS. 15C and 16 are schematic sectional views illustrating the configuration of alternative display devices according to the second embodiment.

These figures show the end surface portion of the display devices 121-123 and 125 formed by cutting the first original substrate 11M and the second original substrate 21M in the state illustrated in FIG. 12A to FIG. 12C and FIG. 14.

As shown in these figures, the first protrusion 50 has a first outer end surface 50e and a first inner end surface 50f. The second protrusion 60 has a second outer end surface 60e and a second inner end surface 60f. The second protrusion 60 includes a first protrusion colored layer 23p. The end surface 23*pe* of the first protrusion colored layer 23*p* is located in the plane including the second outer end surface 60*e* of the second protrusion 60.

Figure 15A:
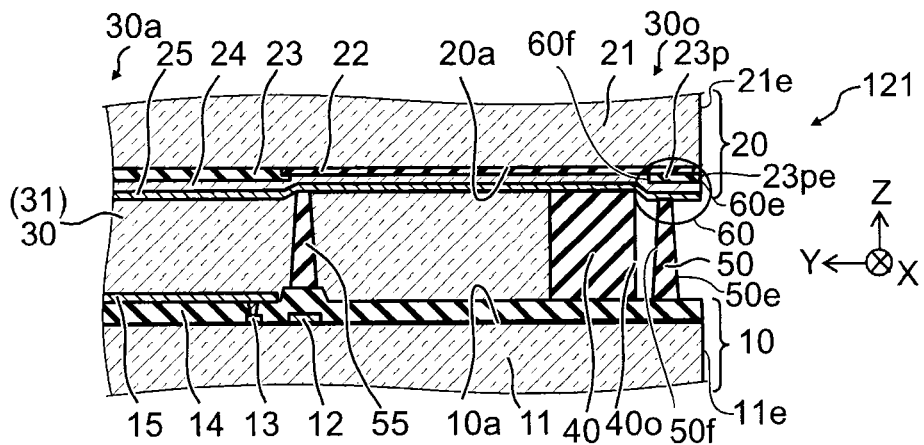
FIG. 15A to FIG. 15C are schematic sectional views illustrating the configuration of alternative display devices according to the second embodiment.

As shown in FIG. 15A, in the display device 121, the second outer end surface 60*e* is located in the plane including one end surface (second substrate end surface 21*e*) of the second substrate 21. For instance, the end surface 23*pe* of the first protrusion colored layer 23*p* is located in the plane including one end surface (second substrate end surface 21*e*) of the second substrate 21. This results from the fact that the second substrate 21 and the second protrusion 60 are collectively divided along one division line DL2.

Figure 15B:
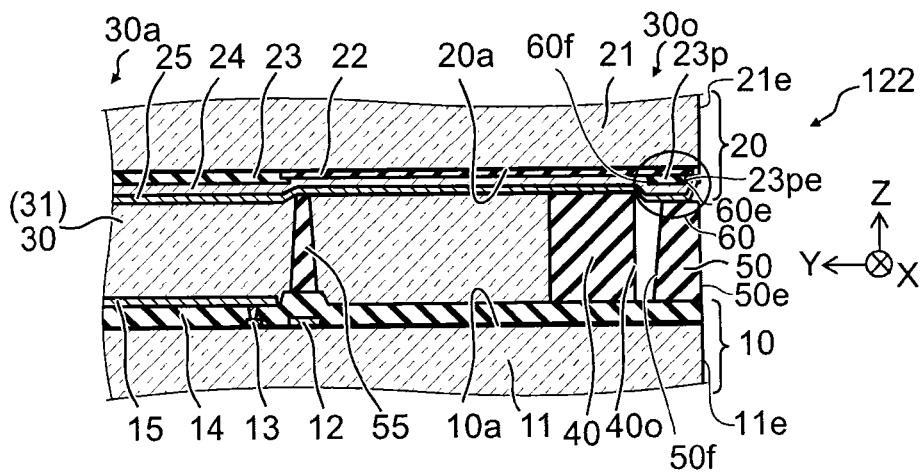

As shown in FIG. 15B, in the display device 122, the first outer end surface 50*e* is located in the plane including one end surface (first substrate end surface 11*e*) of the first substrate 11. This results from the fact that the first substrate 11 and the first protrusion 50 are collectively divided along one division line DL2.

Figure 15C:
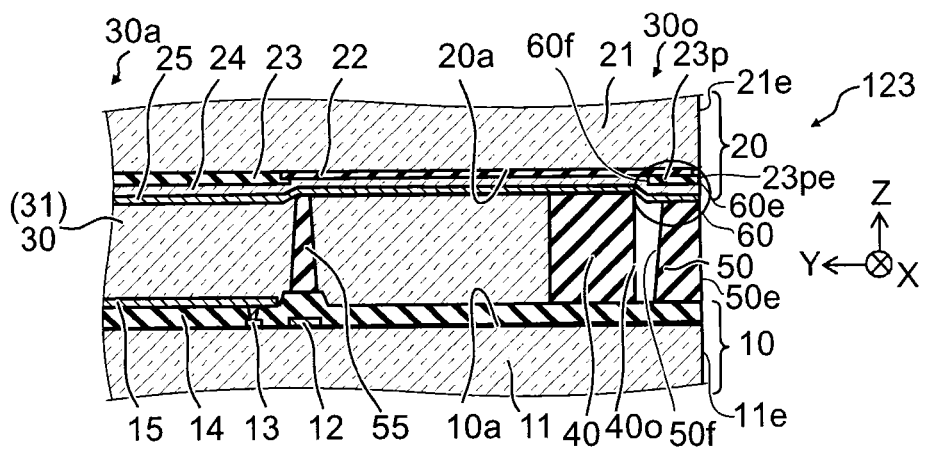

As shown in FIG. 15C, in the display device 123, the first outer end surface 50*e* and the second outer end surface 60*e* are located in the plane including one end surface (first substrate end surface 11*e*) of the first substrate 11. The first outer end surface 50*e* and the second outer end surface 60*e* are located in the plane including one end surface (second substrate end surface 21*e*) of the second substrate 21. This results from the fact that the first substrate 11, the second substrate 21, the first protrusion 50, and the second protrusion 60 are collectively divided along one division line DL2. In this example, the end surface 23*pe* of the first protrusion colored layer 23*p* is located in the plane including one end surface (second substrate end surface 21*e*) of the second substrate 21. The end surface 23*pe* of the first protrusion colored layer 23*p* is located in the plane including one end surface (first substrate end surface 11*e*) of the first substrate 11.

Figure 16:
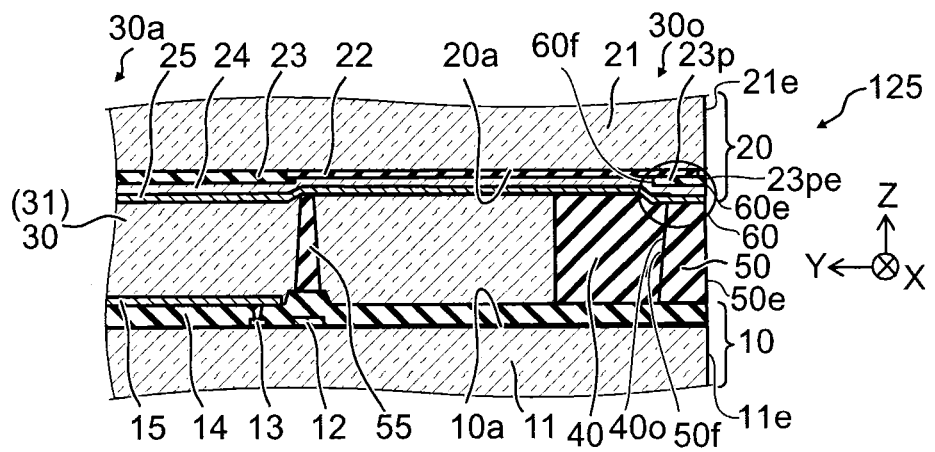
FIG. 16 is a schematic sectional views illustrating the configuration of alternative display device according to the second embodiment.

As shown in FIG. 16, also in the display device 125, the first outer end surface 50*e* and the second outer end surface 60*e* are located in the plane including one end surface (first substrate end surface 11*e*) of the first substrate 11. The first outer end surface 50*e* and the second outer end surface 60*e* are located in the plane including one end surface (second substrate end surface 21*e*) of the second substrate 21. In this example, the end surface 23*pe* of the first protrusion colored layer 23*p* is located in the plane including one end surface (second substrate end surface 21*e*) of the second substrate 21. The end surface 23*pe* of the first protrusion colored layer 23*p* is located in the plane including one end surface (first substrate end surface 11*e*) of the first substrate 11.

Figure 17:
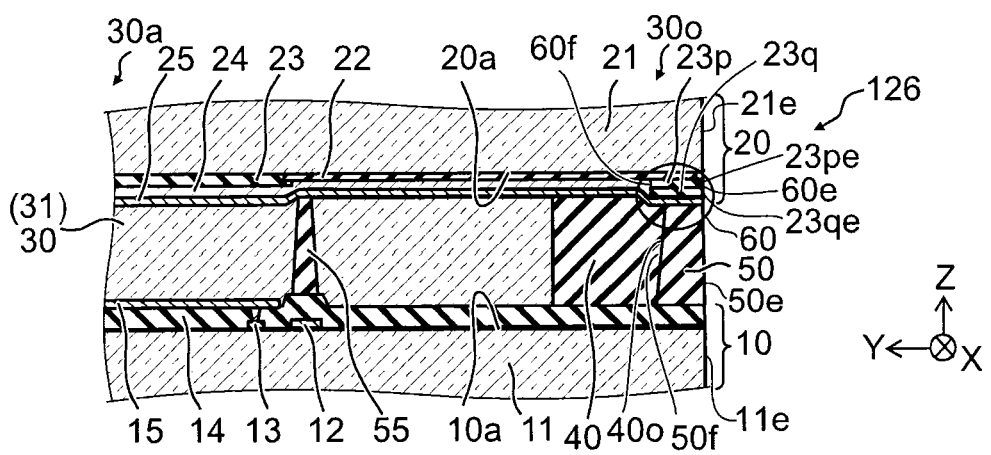
FIG. 17 is a schematic sectional view illustrating the configuration of an alternative display device according to the second embodiment.

FIG. 17 is a schematic sectional view illustrating the configuration of an alternative display device according to the second embodiment. As shown in FIG. 17, the configuration of the display device 126 according to the embodiment is different from that of the display device 124 in that the first protrusion 50 and the second protrusion 60 are in contact with the seal unit 40. More specifically, the second protrusion 60 includes a plurality of stacked colored layers (e.g., a first protrusion colored layer 23*p*, and a second protrusion colored layer 23*q* provided on the first protrusion colored layer 23*p*). The color of the first protrusion colored layer 23*p* is different from the color of the second protrusion colored layer 23*q*. Here, on the second protrusion colored layer 23*q*, another protrusion colored layer may be further provided. The second protrusion 60 includes the first protrusion colored layer 23*p* and the second protrusion colored layer 23*q*.

Also in this case, the first outer end surface 50*e* and the second outer end surface 60*e* are located in the plane including one end surface (first substrate end surface 11*e*) of the first substrate 11. The first outer end surface 50*e* and the second outer end surface 60*e* are located in the plane including one end surface (second substrate end surface 21*e*) of the second substrate 21. In this example, the end surface 23*pe* of the first protrusion colored layer 23*p* is located in the plane including one end surface (second substrate end surface 21*e*) of the second substrate 21. The end surface 23*qe* of the second protrusion colored layer 23*q* included in the second protrusion 60 is located in the plane including the second outer end surface 60*e* of the second protrusion 60.

In the above configurations, at least one of the first protrusion 50 and the second protrusion 60 overlaps with the position of the division line (e.g., division line DL2). This can further narrow the frame. Furthermore, the seal unit 40 is brought into contact with the first protrusion 50 and the second protrusion 60. This can further narrow the frame.

Third Embodiment

The embodiment relates to a display device substrate.

The display device substrate is e.g. the second substrate unit 20 illustrated in FIG. 1A to FIG. 1C. The display device substrate is the second substrate unit 20 described with reference to one of the display devices 110-114 described with reference to the first embodiment, and the display devices 120-126 described with reference to the second embodiment.

That is, the display device substrate (second substrate unit 20) is used as at least one of the two substrates included in the display device (e.g., display device 110). This display device includes two substrates (e.g., first substrate 11 and second substrate 21), a display layer 30 provided between the substrates, and a seal unit 40 surrounding the display layer 30 between the substrates.

The display device substrate (second substrate unit 20) includes a plate-like substrate body (e.g., second substrate 21) and a protrusion (e.g., second protrusion 60).

The substrate body (e.g., second substrate 21) has a major surface (e.g., second major surface 20*a*) provided with a display region 30*a* inside the seal unit 40 and an outside region 30*o* outside the seal unit 40.

The protrusion (second protrusion 60) is provided on the outside region 30*o* of the major surface (second major surface 20*a*). The protrusion (second protrusion 60) lies along the line constituting the outer edge 40*o* of the seal unit 40.

Thus, a display device substrate realizing a display device having a narrow frame can be provided.

As described above, the display device substrate (second substrate unit 20) according to the embodiment can further include a colored layer 23 provided on the outside region 30*o* of the major surface (second major surface 20*a*). Here, the protrusion (second protrusion 60) can include a material identical to the material included in the colored layer 23. That is, the protrusion can include the first protrusion colored layer 23*p* (and a second protrusion colored layer 23*q* and the like) described above.

The display device substrate according to the embodiment can include a second original substrate 21M. That is, the display device substrate can include a plurality of display regions 30*a*. Thus, a plurality of display devices can be collectively manufactured.

Fourth Embodiment

The embodiment relates to a method for manufacturing a display device. An example of this manufacturing method is described above with reference to FIG. 2.

More specifically, in this manufacturing method, for instance, a structural body 110*s* is formed (step S110). The structural body 110s includes a first original substrate 11M, a second original substrate 21M, a seal unit 40, a first protrusion 50, and a second protrusion 60. Then, the portion of the first original substrate 11M outside the seal unit 40 is divided from the portion of the first original substrate 11M inside the seal unit 40. The portion of the second original substrate 21M outside the seal unit 40 is divided from the portion of the second original substrate 21M inside the seal unit 40 (step S120).

Thus, a display device having a narrow frame can be manufactured with high productivity.

Fifth Embodiment

Figure 18:
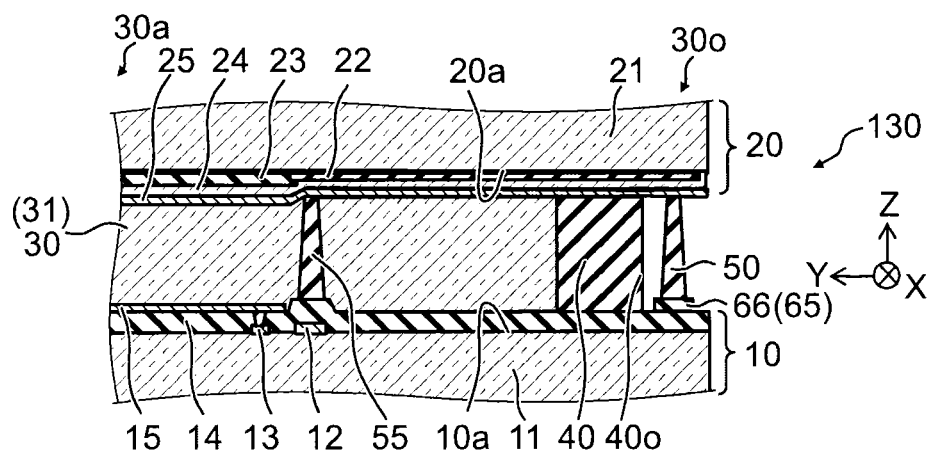
FIG. 18 is a schematic sectional view illustrating the configuration of a display device according to a fifth embodiment.

FIG. 18 is a schematic sectional view illustrating the configuration of a display device according to a fifth embodiment.

As shown in FIG. 18, in the display device 130 according to the embodiment, the spacing adjustment layer 65 is provided on the first major surface 10a of the first substrate 11. That is, the spacing adjustment layer 65 is a height adjustment layer 66. The height adjustment layer 66 is provided e.g. between the first substrate 11 and the first protrusion 50. In this specific example, the height adjustment layer 66 is provided between the interlayer insulating layer 14 and the first protrusion 50. However, the embodiment is not limited thereto. The height adjustment layer 66 may be provided between the interlayer insulating layer 14 and the first substrate 11.

Alternatively, the height adjustment layer 66 may be provided on the first protrusion 50. Here, the height adjustment layer 66 is disposed between the first protrusion 50 and the second substrate unit 20.

Also in the display device 130, the height adjustment layer 66 and the first protrusion 50 constitute a wall for blocking the seal. This suppresses the occurrence of cut failure. Thus, a display device having a narrow frame can be provided.

Sixth Embodiment

Figure 19:
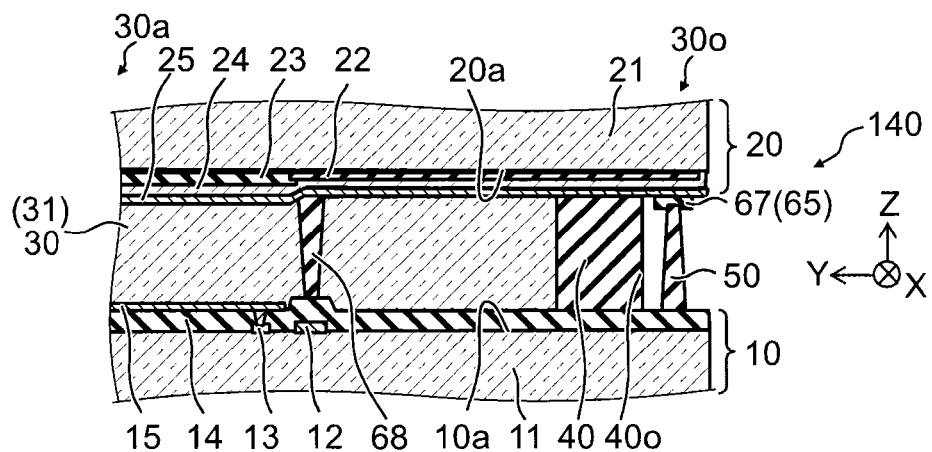
FIG. 19 is a schematic sectional view illustrating the configuration of a display device according to a sixth embodiment.

FIG. 19 is a schematic sectional view illustrating the configuration of a display device according to a sixth embodiment.

As shown in FIG. 19, in the display device 140 according to the embodiment, the spacing adjustment layer 65 is provided on the second major surface 20a of the second substrate 21. That is, the spacing adjustment layer 65 is a height adjustment layer 67 provided on the second major surface 20a.

Furthermore, in the specific example, a spacing holding unit 68 (spacer) is provided on the second major surface 20a. The height adjustment layer 67 can include a material identical to the material included in the spacing holding unit 68.

Also in the display device 140, the height adjustment layer 67 and the first protrusion 50 constitute a wall for blocking the seal. This suppresses the occurrence of cut failure. Thus, a display device having a narrow frame can be provided.

Seventh Embodiment

Figure 20A:
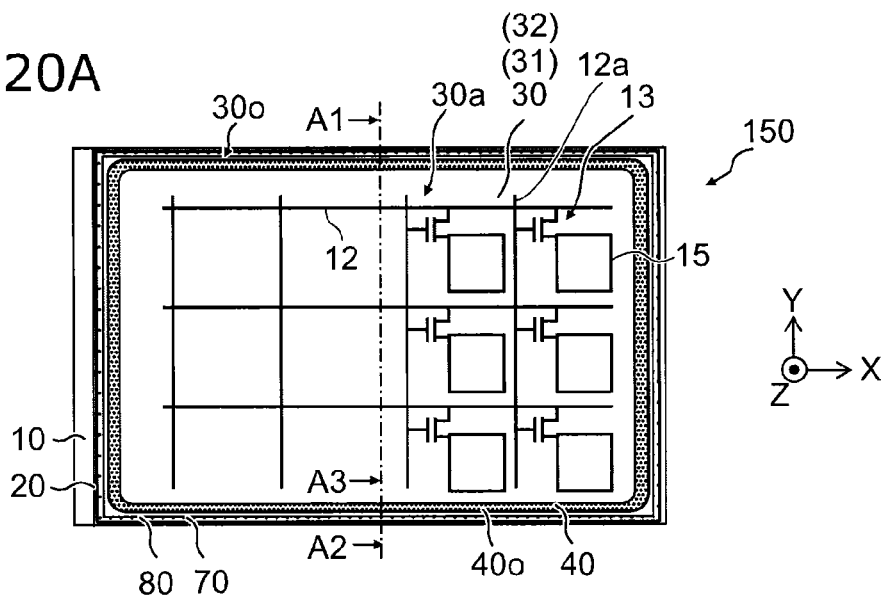
FIG. 20A to FIG. 20C are schematic views illustrating the configuration of a display device according to a seventh embodiment.
Figure 20B:
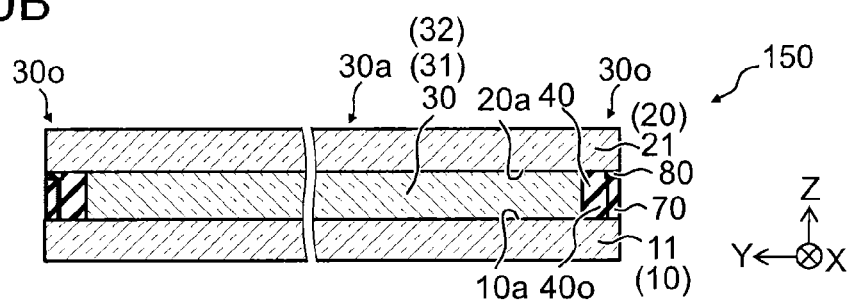
Figure 20C:
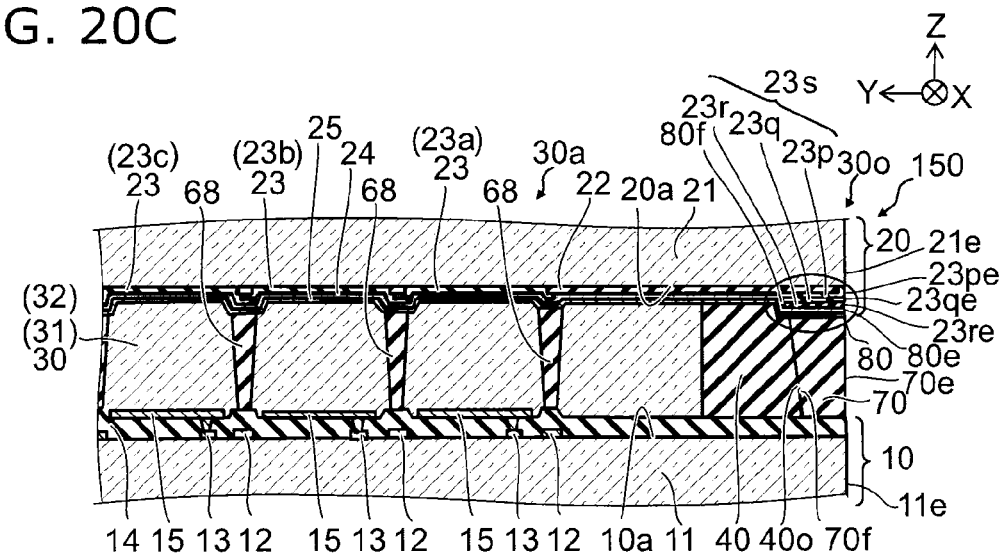

FIG. 20A to FIG. 20C are schematic views illustrating the configuration of a display device according to a seventh embodiment.

FIG. 20A is a plan view. FIG. 20B is a sectional view taken along line A1-A2 of FIG. 20A. FIG. 20C is a sectional view taken along line A3-A2 of FIG. 20A, and a partial enlarged view of FIG. 20B.

As shown in FIG. 20A to FIG. 20C, the display device 150 according to the embodiment includes a first substrate unit 10 (array substrate unit), a second substrate unit 20 (opposing substrate unit), a display layer 30, and a seal unit 40.

The first substrate unit 10 includes a first substrate 11 having a first major surface 10a, a plurality of pixel electrodes 15, and a plurality of transistors (switching elements 13). The plurality of pixel electrodes 15 are provided on the first major surface 10a. The plurality of transistors (switching elements 13) are provided on the first major surface 10a. The plurality of transistors (switching elements 13) are connected to the plurality of pixel electrodes 15, respectively. The first substrate unit 10 can further include an interlayer insulating layer 14. The interlayer insulating layer 14 is provided between the transistor (switching element 13) and the pixel electrode 15. Besides the foregoing, the first substrate unit 10 can further include an interconnection 12 and an interconnection 12a.

The configuration of the pixel electrode 15, the transistor (switching element 13), the interlayer insulating layer 14, the interconnection 12, and the interconnection 12a can be based on the configuration described with reference to the first embodiment, and hence the description thereof is omitted.

The second substrate unit 20 includes a second substrate 21. The second substrate 21 has a second major surface 20a opposed to the first major surface 10a.

The display layer 30 is provided between the first substrate unit 10 and the second substrate unit 20. The display layer 30 is e.g. a liquid crystal layer 31 or an organic luminescent layer 32.

The seal unit 40 surrounds the display layer 30 between the first substrate unit 10 and the second substrate unit 20. Also in this case, the region surrounded with the seal unit 40 is referred to as display region 30a. The outside of the seal unit 40 is referred to as outside region 30o.

In the embodiment, the second substrate unit 20 (opposing substrate unit) further includes a protrusion 70 and a spacing adjustment layer 80. The spacing adjustment layer 80 is provided along the outer edge 40o of the seal unit 40 outside the seal unit 40 (in the outside region 30o) on the second major surface 20a. The spacing adjustment layer 80 is provided along the outer edge 40o between the second substrate 21 and the protrusion 70. As viewed along the Z-axis direction from the first substrate 11 toward the second substrate 21, the spacing adjustment layer 80 includes a portion overlaying the protrusion 70. As projected on the plane parallel to the first major surface 10a, the spacing adjustment layer 80 includes a portion overlaying the protrusion 70. The spacing adjustment layer 80 is in contact with the protrusion 70.

The display device 150 can be manufactured by the manufacturing method including forming a structural body (step S110) and division (step S120) described with reference to FIG. 2. Here, the protrusion 70 and the spacing adjustment layer 80 are in contact with each other. The protrusion 70 forms a wall in conjunction with the spacing adjustment layer 80. For instance, the position of the seal unit 40 may be displaced from the design position, or the width of the seal unit 40 may be larger than the design value. However, even in these cases, the wall made of the protrusion 70 and the spacing adjustment layer 80 stops the flow of the liquid composition constituting the seal unit 40. Thus, even in such cases, the division line DL2 does not overlap with the seal unit 40. This suppresses the occurrence of cut failure.

Furthermore, because the seal unit 40 does not overlap with the division line DL2, the seal unit 40 and the division line DL2 can be made close to each other. This can narrow the width of the frame. The embodiment can provide a display device having a narrow frame.

In this example, the second substrate unit 20 (opposing substrate unit) further includes a plurality of colored layers 23 provided on the second major surface 20a. The colored layers 23 include a first colored film 23a having a first color, a second colored film 23b having a second color, and a third colored film 23c having a third color. The second color is different from the first color. The third color is different from the first color, and also different from the second color. For instance, the first color is red, the second color is green, and the third color is blue. The colored layer 23 is a color filter.

The plurality of colored layers 23 are opposed to the plurality of pixel electrodes 15, respectively. That is, as projected on the plane parallel to the first major surface 10a, the plurality of colored layers 23 overlay the plurality of pixel electrodes 15, respectively.

In this example, the spacing adjustment layer 80 is at least part of the colored layer 23. The spacing adjustment layer 80 is e.g. a stacked film 23s including a first protrusion colored layer 23p, a second protrusion colored layer 23q, and a third protrusion colored layer 23r. For instance, the second protrusion colored layer 23q is provided on the first protrusion colored layer 23p, and the third protrusion colored layer 23r is provided on the second protrusion colored layer 23q. For instance, the first protrusion colored layer 23p, the second protrusion colored layer 23q, and the third protrusion colored layer 23r are e.g. films constituting the first colored film 23a, the second colored film 23b, and the third colored film 23c, respectively.

The spacing adjustment layer 80 may be a stacked film of two of the films constituting the first colored film 23a, the second colored film 23b, and the third colored film 23c constituting the colored layers 23. That is, the spacing adjustment layer 80 can include a stacked film 23s including at least two films of the first colored film 23a, the second colored film 23b, and the third colored film 23c. Alternatively, the spacing adjustment layer 80 may be one of the first colored film 23a, the second colored film 23b, and the third colored film 23c.

The spacing adjustment layer 80 can include a material identical to the material included in the colored layer 23. The spacing adjustment layer 80 can be formed simultaneously in forming the colored layer 23. This provides high productivity. Furthermore, by using a stacked film 23s of a plurality of colored layers 23 (e.g., first colored film 23a, second colored film 23b, and third colored film 23c), the thickness of the spacing adjustment layer 80 can be easily controlled. This enhances close contact between the protrusion 70 and the spacing adjustment layer 80. Thus, the flow of the liquid composition constituting the seal unit 40 is suppressed more effectively.

In this example, the second substrate unit 20 further includes a plurality of spacing holding units 68 (spacers). The plurality of spacing holding units 68 are provided on the second major surface 20a in the interior (display region 30a) surrounded with the seal unit 40. The spacing holding unit 68 holds the spacing between the first substrate unit 10 and the second substrate unit 20. The spacing holding unit 68 can be made of e.g. acrylic resin or polyimide resin. However, the spacing holding unit 68 can be made of an arbitrary material. The spacing holding unit 68 is preferably insulative.

In this example, the protrusion 70 is formed from a material used for the spacing holding unit 68. That is, the protrusion 70 includes a material identical to the material included in the spacing holding unit 68 (spacer). The protrusion 70 can be formed simultaneously in forming the spacing holding unit 68. This provides high productivity.

Also in the display device 150, the protrusion 70 has an inner end surface 70f and an outer end surface 70e. The inner end surface 70f is non-parallel to the second major surface 20a, and opposed to the outer edge 40o of the seal unit 40. The outer end surface 70e is non-parallel to the second major surface 20a, and is an end surface on the opposite side to the inner end surface 70f. The outer end surface 70e (at least part of the outer end surface 70e) is located in the plane including one end surface (second substrate end surface 21e) of the second substrate 21.

For instance, a manufacturing method similar to the manufacturing method described with reference to e.g. FIG. 3A, FIG. 3B, and FIG. 6C can be used to provide a protrusion 70 at the position of the division line DL2. Thus, the second substrate 21 and the protrusion 70 are collectively divided along one division line DL2. Hence, the above configuration is formed. This can further narrow the frame.

In this example, the spacing adjustment layer 80 has an inner end surface 80f and an outer end surface 80e. The inner end surface 80f is non-parallel to the second major surface 20a, and opposed to the outer edge 40o of the seal unit 40. The outer end surface 80e is non-parallel to the second major surface 20a, and is an end surface on the opposite side to the inner end surface 80f. The outer end surface 80e (at least part of the outer end surface 80e) is located in the plane including one end surface (second substrate end surface 21e) of the second substrate 21.

In this example, the spacing adjustment layer 80 includes a first protrusion colored layer 23p, a second protrusion colored layer 23q, and a third protrusion colored layer 23r. The end surface 23pe (outer end surface) of the first protrusion colored layer 23p, the end surface 23qe (outer end surface) of the second protrusion colored layer 23q, and the end surface 23re (outer end surface) of the third protrusion colored layer 23r are located in the plane including one end surface (second substrate end surface 21e) of the second substrate 21.

Figure 21A:
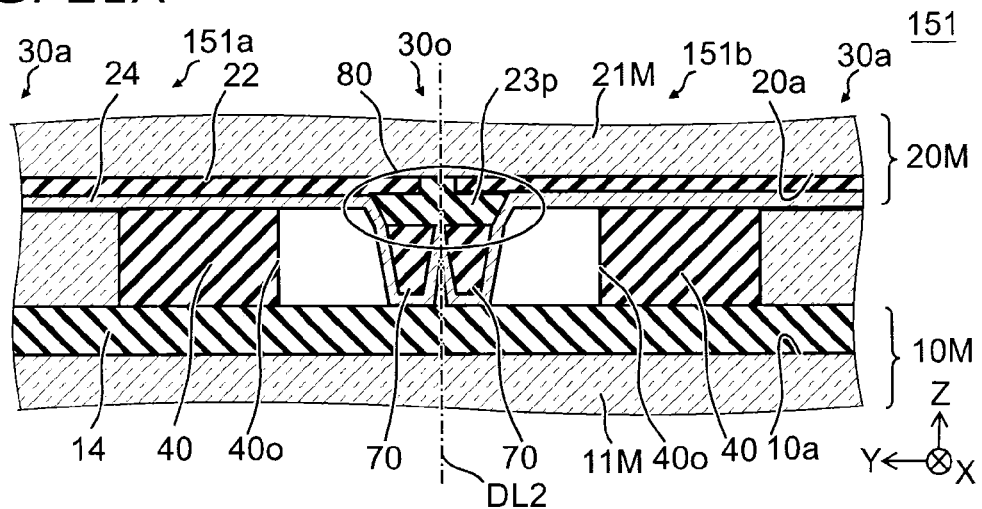
FIG. 21A to FIG. 21C are schematic sectional views illustrating the configuration of alternative display devices according to the seventh embodiment.
Figure 21B:
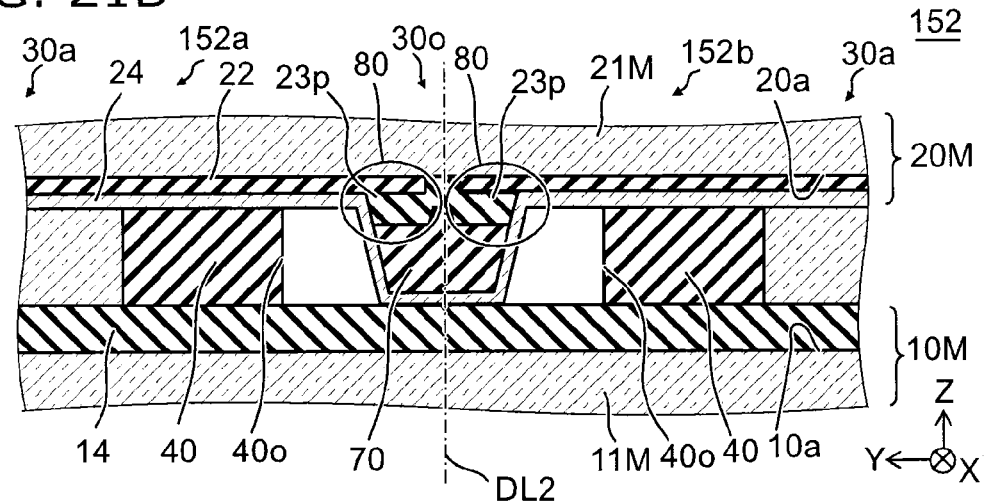
Figure 21C:
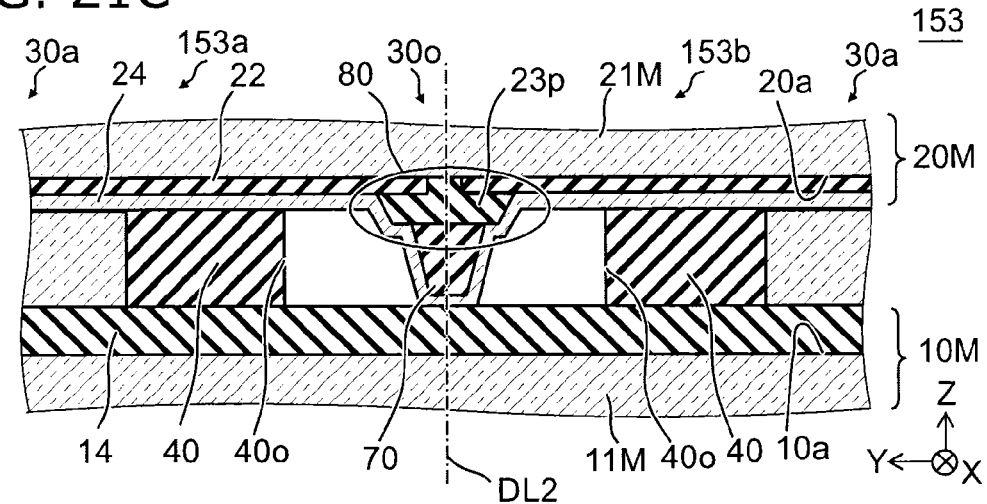

FIG. 21A to FIG. 21C are schematic sectional views illustrating the configuration of alternative display devices according to the seventh embodiment.

These figures illustrate the configuration of the peripheral portion of the display devices according to the embodiment.

As shown in FIG. 21A, in the display device 151, the division line DL2 overlaps with the spacing adjustment layer 80. The spacing adjustment layer 80 including a first protrusion colored layer 23p is provided on the boundary between the display device 151a and the display device 151b. Each of the display device 151a and the display device 151b includes a protrusion 70.

As shown in FIG. 21B, in the display device 152, the division line DL2 overlaps with the protrusion 70. The protrusion 70 is provided on the boundary between the display device 152a and the display device 152b. Each of the display device 152a and the display device 152b includes a spacing adjustment layer 80 including a first protrusion colored layer 23p.

As shown in FIG. 21C, in the display device 153, the protrusion 70 and the spacing adjustment layer 80 including a first protrusion colored layer 23p overlap with the division line DL2. The protrusion 70 and the spacing adjustment layer 80 including the first protrusion colored layer 23p are provided on the boundary between the display device 153a and the display device 153b.

Figure 22:
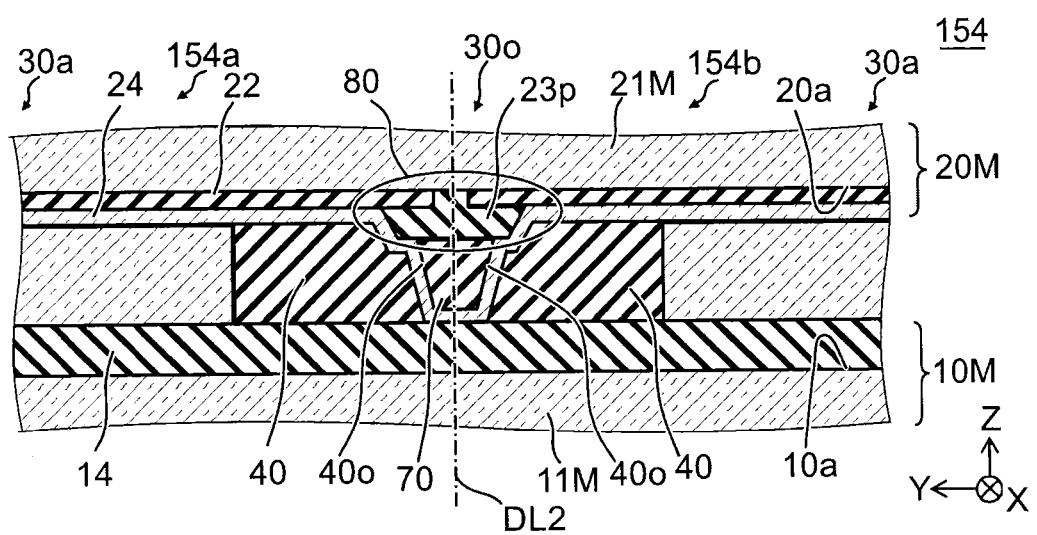
FIG. 22 is a schematic sectional view illustrating the configuration of an alternative display device according to the seventh embodiment.

FIG. 22 is a schematic sectional view illustrating the configuration of an alternative display device according to the seventh embodiment. As shown in FIG. 22, in the display device 154, the spacing adjustment layer 80 includes a first protrusion colored layer 23p. The protrusion 70 and the spacing adjustment layer 80 are in contact with the seal unit 40. That is, the protrusion 70 and the spacing adjustment layer 80 are provided on the boundary between the display device 154a and the display device 154b adjacent to each other. The seal unit 40 is closely attached to the protrusion 70 and the spacing adjustment layer 80. This realizes a very narrow frame. Also in this case, the protrusion 70 and the spacing adjustment layer 80 constitute a wall. Thus, the division line DL2 does not overlap with the seal unit 40. This can suppress the occurrence of cut failure.

In FIG. 21A to FIG. 21C and FIG. 22, for clarity of illustration, the opposing electrode 25 is not shown.

FIG. 23A to FIG. 23C and FIG. 24 are schematic sectional views illustrating the configuration of alternative display devices according to the seventh embodiment.

These figures show the end surface portion of the display devices 151-154 formed by cutting the first original substrate 11M and the second original substrate 21M in the state illustrated in FIG. 21A to FIG. 21C and FIG. 22.

Figure 23A:
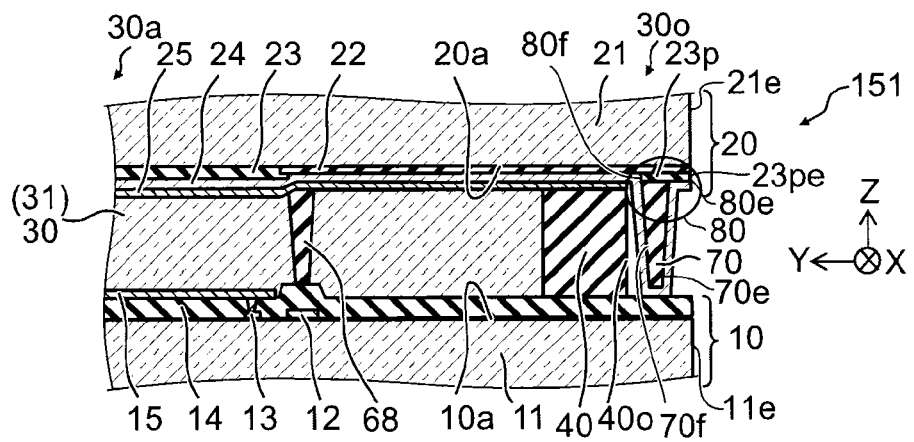
FIG. 23A to FIG. 23C are schematic sectional views illustrating the configuration of alternative display devices according to the seventh embodiment.

As shown in FIG. 23A, in the display device 151, the second outer end surface 80e is located in the plane including one end surface (second substrate end surface 21e) of the second substrate 21. For instance, the end surface 23pe of the first protrusion colored layer 23p is located in the plane including one end surface (second substrate end surface 21e) of the second substrate 21.

Figure 23B:
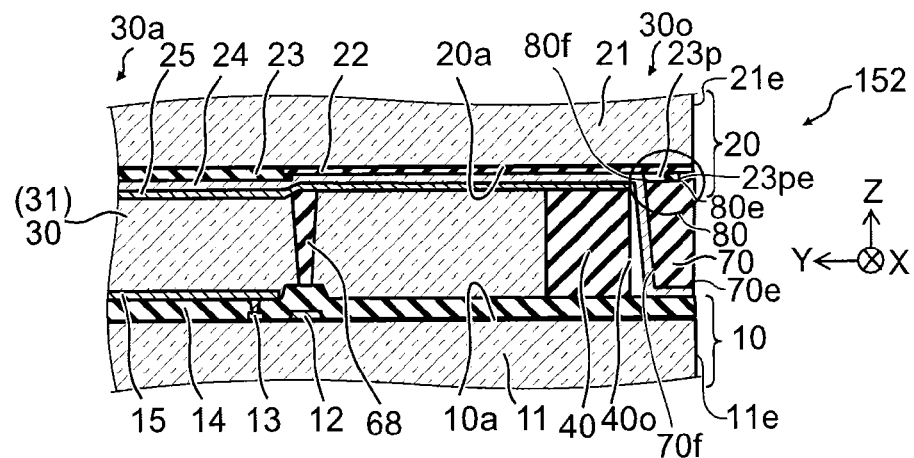

As shown in FIG. 23B, in the display device 152, the outer end surface 70e of the protrusion 70 is located in the plane including one end surface (second substrate end surface 21e) of the second substrate 21.

Figure 23C:
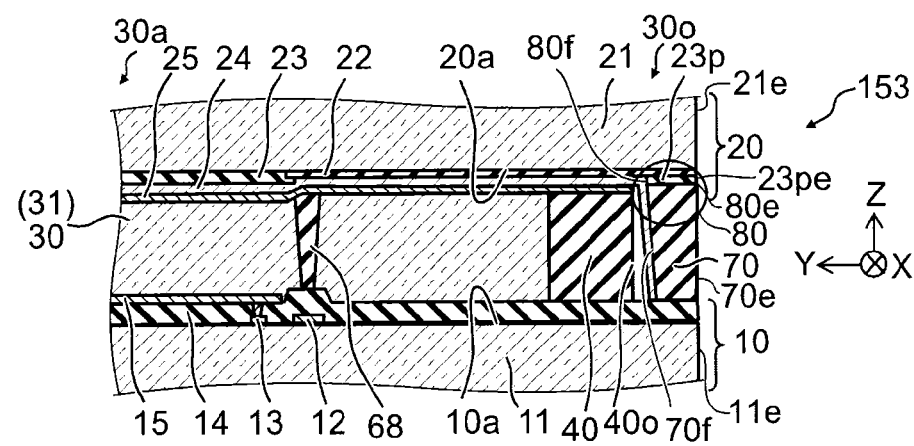
Figure 24:
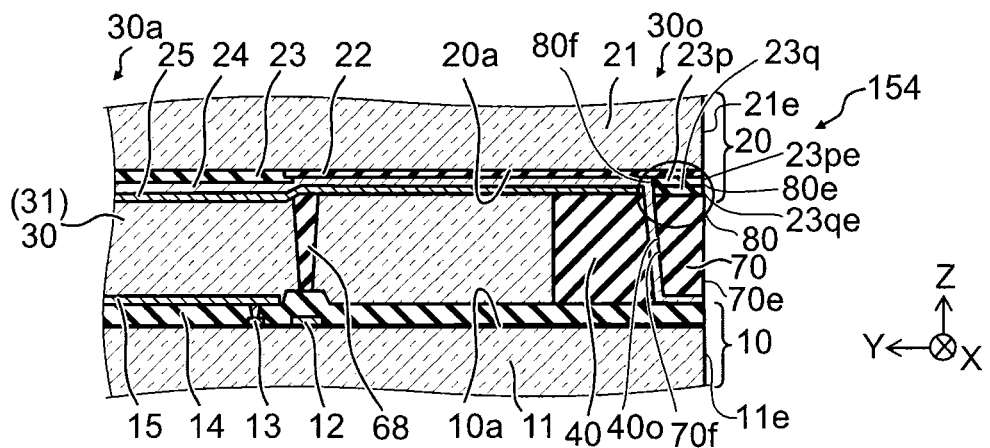
FIG. 24 is a schematic sectional view illustrating the configuration of alternative display device according to the seventh embodiment.

As shown in FIG. 23C and FIG. 24, in the display devices 153 and 154, the outer end surface 70e and the outer end surface 80e are located in the plane including one end surface (second substrate end surface 21e) of the second substrate 21. Furthermore, in this example, the outer end surface 70e and the outer end surface 80e are located in the plane including one end surface (first substrate end surface 11e) of the first substrate 11. This results from the fact that the first substrate 11, the second substrate 21, the protrusion 70, and the spacing adjustment layer 80 are collectively divided along one division line DL2. This can further narrow the frame.

Furthermore, as shown in FIG. 24, in the display device 154, the protrusion 70 and the spacing adjustment layer 80 are in contact with the seal unit 40. This can further narrow the frame.

Figure 25:
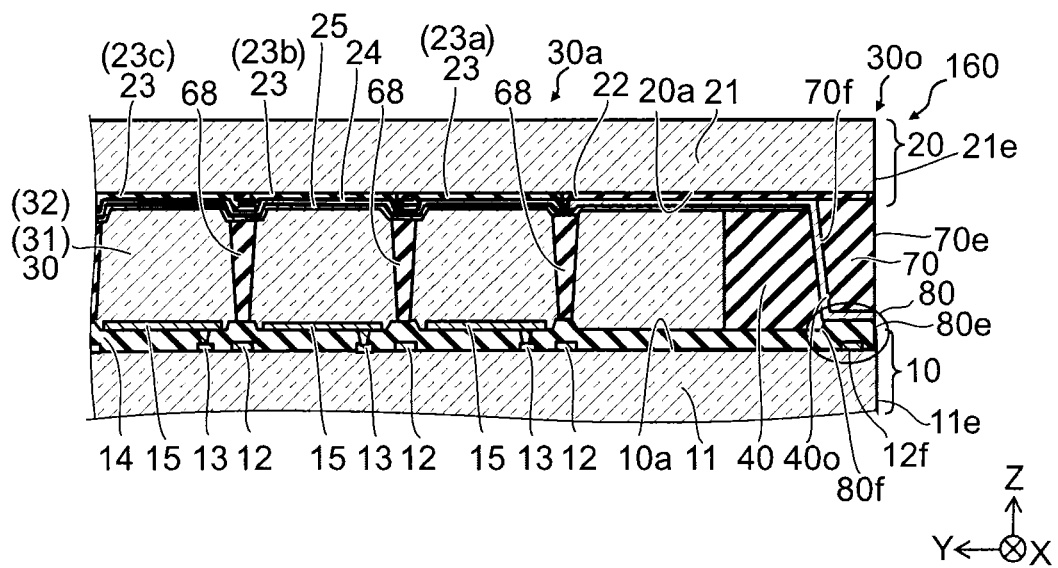
FIG. 25 is a schematic sectional view illustrating the configuration of a display device according to an eighth embodiment.

FIG. 25 is a schematic sectional view illustrating the configuration of a display device according to an eighth embodiment.

FIG. 25 is a sectional view corresponding to the cross section taken along line A2-A3 of FIG. 20A.

As shown in FIG. 25, the display device 160 according to the embodiment includes a first substrate unit 10 (array substrate unit), a second substrate unit 20 (opposing substrate unit), a display layer 30, and a seal unit 40.

Also in this case, the first substrate unit 10 includes a first substrate 11 having a first major surface 10a, a plurality of pixel electrodes 15, and a plurality of transistors (switching elements 13). The second substrate unit 20 includes a second substrate 21. The display layer 30 is provided between the first substrate unit 10 and the second substrate unit 20. The seal unit 40 surrounds the display layer 30 between the first substrate unit 10 and the second substrate unit 20. These configurations are similar to those of the display device 150, and hence the description thereof is omitted.

In the display device 160, the second substrate unit 20 (opposing substrate unit) includes a protrusion 70. Also in this case, the protrusion 70 is provided along the outer edge 40o of the seal unit 40 outside the seal unit 40 (in the outside region 30o) on the second major surface 20a of the second substrate 21.

Furthermore, the first substrate unit 10 includes a spacing adjustment layer 80. The spacing adjustment layer 80 is provided along the outer edge 40o of the seal unit 40 at the outside (in the outside region 30o) on the first major surface 10a of the first substrate 11. As viewed along the direction from the first substrate 11 toward the second substrate 21, the spacing adjustment layer 80 includes a portion overlaying the protrusion 70, and is in contact with the protrusion 70. As projected on the plane parallel to the first major surface 10a, the spacing adjustment layer 80 includes a portion overlaying the protrusion 70.

In this example, the first substrate unit 10 further includes an interlayer insulating layer 14 provided between the pixel electrode 15 and the transistor (switching element 13). At least a part of the spacing adjustment layer 80 is formed from the interlayer insulating layer 14. In this example, on the outside region 30o of the first major surface 10a, a peripheral portion layer 12f including a layer constituting an interconnection 12 is provided. On the peripheral portion layer 12f, a layer constituting the interlayer insulating layer 14 is provided. The spacing adjustment layer 80 includes the layer constituting the interlayer insulating layer 14, and the peripheral portion layer 12f. The spacing adjustment layer 80 includes a material identical to the material included in the interlayer insulating layer 14. The spacing adjustment layer 80 can be formed simultaneously in forming the interlayer insulating layer 14. This provides high productivity.

The display device 160 can also be manufactured by the manufacturing method including forming a structural body (step S110) and division (step S120) described with reference to FIG. 2. Also in this example, the protrusion 70 and the spacing adjustment layer 80 are in contact with each other. The protrusion 70 forms a wall in conjunction with the spacing adjustment layer 80. For instance, the position of the seal unit 40 may be displaced from the design position, or the width of the seal unit 40 may be larger than the design value. However, even in these cases, the wall made of the protrusion 70 and the spacing adjustment layer 80 stops the flow of the liquid composition constituting the seal unit 40. Thus, even in such cases, the division line DL2 does not overlap the seal unit 40. This suppresses the occurrence of cut failure.

Furthermore, because the seal unit 40 does not overlap with the division line DL2, the seal unit 40 and the division line DL2 can be made close to each other. This can narrow the width of the frame. The embodiment can provide a display device having a narrow frame.

Also in the display device 160, the second substrate unit 20 (opposing substrate unit) includes a plurality of colored layers 23 (e.g., first colored film 23a, second colored film 23b, and third colored film 23c) provided on the second major surface 20a. The plurality of colored layers 23 are opposed to the plurality of pixel electrodes 15, respectively. The second substrate unit 20 is a color filter substrate.

Also in the display device 160, the second substrate unit 20 further includes a plurality of spacing holding units 68 (spacers). The plurality of spacing holding units 68 are provided on the second major surface 20a in the interior (display region 30a) surrounded with the seal unit 40. The spacing holding unit 68 holds the spacing between the first substrate unit 10 and the second substrate unit 20.

The protrusion 70 includes a material identical to the material included in the spacing holding unit 68 (spacer). The protrusion 70 can be formed simultaneously in forming the spacing holding unit 68. This provides high productivity.

Also in the display device 160, the protrusion 70 has an inner end surface 70f and an outer end surface 70e. The inner end surface 70f is non-parallel to the second major surface 20a, and opposed to the outer edge 40o of the seal unit 40. The outer end surface 70e is non-parallel to the second major surface 20a, and is an end surface on the opposite side to the inner end surface 70f. The outer end surface 70e (at least part of the outer end surface 70e) is located in the plane including one end surface (second substrate end surface 21e) of the second substrate 21.

For instance, a manufacturing method similar to the manufacturing method described with reference to e.g. FIGS. 3A, 3B, and 6C can be used to provide a protrusion 70 at the position of the division line DL2. Thus, the second substrate 21 and the protrusion 70 are collectively divided along one division line DL2. Hence, the above configuration is formed. This can further narrow the frame.

The spacing adjustment layer 80 has an inner end surface 80f and an outer end surface 80e. The outer end surface 80e (at least part of the outer end surface 80e) is located in the plane including one end surface (first substrate end surface 11e) of the first substrate 11.

The embodiments provide a display device having a narrow frame, a display device substrate, and a method for manufacturing a display device.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

The embodiments of the invention have been described above with reference to examples. However, the embodiments of the invention are not limited to these examples. For instance, any specific configurations of various components such as the first substrate, second substrate, first substrate unit, second substrate unit, display layer, liquid crystal layer, seal unit, first protrusion, second protrusion, spacing adjustment layer, spacing holding unit, height adjustment layer, interlayer insulating layer, switching element (transistor), pixel electrode, colored layer, colored film, and protrusion colored layer included in the display device are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the invention to the extent that the purport of the invention is included.

In addition, those skilled in the art can suitably modify and implement the display device described above in the embodiments of the invention. All the display devices thus modified are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A display device comprising:
a first substrate;
a second substrate;
a display layer provided between the first substrate and the second substrate;
a seal unit surrounding the display layer between the first substrate and the second substrate;
a protrusion provided along an outer edge of the seal unit at an outside of the seal unit on a first major surface of the first substrate facing the display layer;
a spacing adjustment layer provided along the outer edge at the outside of the seal unit, including a portion overlaying the protrusion as viewed along a direction from the first substrate toward the second substrate, and being in contact with the protrusion;
the protrusion includes:
an inner end surface being non-parallel to the first major surface and opposed to the outer edge; and
an outer end surface being non-parallel to the first major surface and lying on an opposite side to the inner end surface, and
at least a part of the outer end surface is located in a plane including one end surface of the first substrate.

2. The device according to claim 1, wherein the spacing adjustment layer is provided on the first major surface.

3. The device according to claim 1, further comprising:
a plurality of colored layers provided in an interior surrounded with the seal unit,
the spacing adjustment layer including a material identical to a material included in the colored layers.

4. The device according to claim 3, wherein the colored layers are provided on the first major surface.

5. The device according to claim 3, wherein
the plurality of colored layers include a first colored film having a first color, a second colored film having a second color different from the first color, and a third colored film having a third color different from the first color and different from the second color, and
the spacing adjustment layer includes at least two films of the first colored film, the second colored film, and the third colored film.

6. The device according to claim 3, wherein the spacing adjustment layer includes at least one of a blue portion and a green portion.

7. The device according to claim 1, further comprising:
a plurality of spacing holding units provided in an interior surrounded with the seal unit and holding a spacing between the first substrate and the second substrate,
at least one of the protrusion and the spacing adjustment layer including a material identical to a material included in the spacing holding units.

8. The device according to claim 7, wherein the spacing holding unit is provided on the first major surface.

9. The device according to claim 1, wherein the spacing adjustment layer is provided on a second major surface of the second substrate facing the display layer.

* * * * *